United States Patent
Yamazaki et al.

(10) Patent No.: US 9,306,072 B2
(45) Date of Patent: *Apr. 5, 2016

(54) OXIDE SEMICONDUCTOR LAYER AND SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masayuki Sakakura, Tochigi (JP); Akiharu Miyanaga, Hadano (JP); Masahiro Takahashi, Atsugi (JP); Takuya Hirohashi, Atsugi (JP); Takashi Shimazu, Nagoya (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/660,219

(22) Filed: Oct. 25, 2012

(65) Prior Publication Data

US 2013/0062601 A1 Mar. 14, 2013

Related U.S. Application Data

(63) Continuation of application No. 12/897,160, filed on Oct. 4, 2010, now Pat. No. 8,319,218.

(30) Foreign Application Priority Data

Oct. 8, 2009 (JP) .................................. 2009-234507

(51) Int. Cl.
*H01L 29/10* (2006.01)
*H01L 29/786* (2006.01)

(52) U.S. Cl.
CPC ...... *H01L 29/7869* (2013.01); *H01L 29/78606* (2013.01); *H01L 29/78693* (2013.01)

(58) Field of Classification Search
CPC ............ H01L 27/1214; H01L 27/1225; H01L 27/1229; H01L 27/1251; H01L 29/7869; H01L 29/78693; H01L 29/78606; H01L 29/045; H01L 29/04; H01L 29/41733
USPC ......... 257/43, 57, E29.08, E29.296, E51.005; 438/104, 149, 150, 151
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 102498553 A 6/2012
EP 1 737 044 A 12/2006
(Continued)

OTHER PUBLICATIONS

European Search Report (Application No. 10821847.0) Dated Jun. 10, 2013.
(Continued)

*Primary Examiner* — Khiem D Nguyen
(74) *Attorney, Agent, or Firm* — Robinson Intellectual Property Law Office; Eric J. Robinson

(57) ABSTRACT

An object is to provide an oxide semiconductor layer having a novel structure which is preferably used for a semiconductor device. Alternatively, another object is to provide a semiconductor device using an oxide semiconductor layer having the novel structure. An oxide semiconductor layer includes an amorphous region which is mainly amorphous and a crystal region containing crystal grains of $In_2Ga_2ZnO_7$ in a vicinity of a surface, in which the crystal grains are oriented so that the c-axis is almost vertical with respect to the surface. Alternatively, a semiconductor device uses such an oxide semiconductor layer.

15 Claims, 24 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,511,343 B2 | 3/2009 | Li et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,893,495 B2 | 2/2011 | Li et al. |
| 7,910,490 B2 | 3/2011 | Akimoto et al. |
| 7,932,521 B2 | 4/2011 | Akimoto et al. |
| 7,935,964 B2 | 5/2011 | Kim et al. |
| 7,977,169 B2 | 7/2011 | Hirao et al. |
| 7,998,372 B2 | 8/2011 | Yano et al. |
| 8,017,513 B2 | 9/2011 | Jeong et al. |
| 8,063,421 B2 | 11/2011 | Kang et al. |
| 8,168,544 B2 | 5/2012 | Chang |
| 8,188,467 B2 | 5/2012 | Itagaki et al. |
| 8,202,365 B2 | 6/2012 | Umeda et al. |
| 8,207,756 B2 | 6/2012 | Shionoiri et al. |
| 8,236,635 B2 | 8/2012 | Suzawa et al. |
| 8,242,494 B2 | 8/2012 | Suzawa et al. |
| 8,274,077 B2 | 9/2012 | Akimoto et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,319,218 B2 * | 11/2012 | Yamazaki et al. ............... 257/43 |
| 8,343,799 B2 | 1/2013 | Ito et al. |
| 8,466,463 B2 | 6/2013 | Akimoto et al. |
| 8,563,977 B2 | 10/2013 | Shimada et al. |
| 8,629,069 B2 | 1/2014 | Akimoto et al. |
| 8,669,550 B2 | 3/2014 | Akimoto et al. |
| 8,796,679 B2 | 8/2014 | Jeong et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 * | 8/2007 | Hirao et al. ..................... 257/43 |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0008638 A1 | 1/2009 | Kang et al. |
| 2009/0020753 A1 * | 1/2009 | Jeong et al. ..................... 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1 | 6/2009 | Son et al. |
| 2009/0152506 A1 * | 6/2009 | Umeda et al. ................. 252/500 |
| 2009/0152541 A1 | 6/2009 | Maekawa et al. |
| 2009/0224239 A1 | 9/2009 | Wakita |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0065845 A1 | 3/2010 | Nakayama |
| 2010/0072467 A1 | 3/2010 | Yamazaki et al. |
| 2010/0084648 A1 | 4/2010 | Watanabe |
| 2010/0084650 A1 | 4/2010 | Yamazaki et al. |
| 2010/0084651 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0117999 A1 | 5/2010 | Matsunaga et al. |
| 2010/0123130 A1 | 5/2010 | Akimoto et al. |
| 2010/0123136 A1 | 5/2010 | Lee et al. |
| 2010/0136743 A1 | 6/2010 | Akimoto et al. |
| 2010/0140611 A1 * | 6/2010 | Itagaki et al. .................... 257/43 |
| 2010/0193782 A1 | 8/2010 | Sakata |
| 2010/0213459 A1 | 8/2010 | Shimada et al. |
| 2010/0295042 A1 | 11/2010 | Yano et al. |
| 2010/0301329 A1 | 12/2010 | Asano et al. |
| 2011/0062433 A1 | 3/2011 | Yamazaki et al. |
| 2011/0062436 A1 | 3/2011 | Yamazaki et al. |
| 2011/0104851 A1 | 5/2011 | Akimoto et al. |
| 2011/0117697 A1 | 5/2011 | Akimoto et al. |
| 2011/0117698 A1 | 5/2011 | Suzawa et al. |

(56) References Cited

U.S. PATENT DOCUMENTS

| | | | |
|---|---|---|---|
| 2011/0121290 A1 | 5/2011 | Akimoto et al. | |
| 2012/0132911 A1 | 5/2012 | Shimada et al. | |
| 2012/0256179 A1 | 10/2012 | Yamazaki et al. | |

FOREIGN PATENT DOCUMENTS

| | | | | |
|---|---|---|---|---|
| EP | 1770788 A | 4/2007 | | |
| EP | 1921681 A | 5/2008 | | |
| EP | 1995787 A | 11/2008 | | |
| EP | 1998373 A | 12/2008 | | |
| EP | 1998374 A | 12/2008 | | |
| EP | 1998375 A | 12/2008 | | |
| EP | 2017881 A | 1/2009 | | |
| EP | 2 226 847 A | 9/2010 | | |
| EP | 2544237 A | 1/2013 | | |
| JP | 60-198861 A | 10/1985 | | |
| JP | 63-210022 A | 8/1988 | | |
| JP | 63-210023 A | 8/1988 | | |
| JP | 63-210024 A | 8/1988 | | |
| JP | 63-215519 A | 9/1988 | | |
| JP | 63-239117 A | 10/1988 | | |
| JP | 63-265818 A | 11/1988 | | |
| JP | 05-251705 | 9/1993 | | |
| JP | 08-264794 | 10/1996 | | |
| JP | 11-505377 | 5/1999 | | |
| JP | 2000-026119 A | 1/2000 | | |
| JP | 2000-044236 A | 2/2000 | | |
| JP | 2000-150900 | 5/2000 | | |
| JP | 2002-076356 A | 3/2002 | | |
| JP | 2002-289859 A | 10/2002 | | |
| JP | 2003-086000 | 3/2003 | | |
| JP | 2003-086808 | 3/2003 | | |
| JP | 2003-273400 A | 9/2003 | | |
| JP | 2004-103957 | 4/2004 | | |
| JP | 2004-273614 A | 9/2004 | | |
| JP | 2004-273732 A | 9/2004 | | |
| JP | 2006-165529 | 6/2006 | | |
| JP | 2007-096055 | 4/2007 | | |
| JP | 2007-123861 | 5/2007 | | |
| JP | 2007-220820 | * | 8/2007 | ............ H01L 29/786 |
| JP | 2007-220820 A | 8/2007 | | |
| JP | 2007-311404 A | 11/2007 | | |
| JP | 2008-098637 A | 4/2008 | | |
| JP | 2008-533693 | 8/2008 | | |
| JP | 2008-219008 A | 9/2008 | | |
| JP | 2008-281988 A | 11/2008 | | |
| JP | 2009-021536 A | 1/2009 | | |
| JP | 2009-021612 A | 1/2009 | | |
| JP | 2009-031742 A | 2/2009 | | |
| JP | 2009-099944 | * | 5/2009 | ............ H01L 29/786 |
| JP | 2009-099944 A | 5/2009 | | |
| JP | 2009-167087 A | 7/2009 | | |
| TW | 200915576 | 4/2009 | | |
| TW | 200929546 | 7/2009 | | |
| WO | WO 2004/114391 | 12/2004 | | |
| WO | WO 2005/088726 | 9/2005 | | |
| WO | WO-2007/058231 | 5/2007 | | |
| WO | WO-2007/094501 | 8/2007 | | |
| WO | WO-2007/148601 | 12/2007 | | |
| WO | WO-2008/126878 | 10/2008 | | |
| WO | WO 2008/126879 | 10/2008 | | |
| WO | WO-2008/126884 | 10/2008 | | |
| WO | WO-2008/149754 | 12/2008 | | |
| WO | WO-2009/034953 | 3/2009 | | |
| WO | WO-2009/041544 | 4/2009 | | |
| WO | WO-2009/093625 | 7/2009 | | |
| WO | WO-2011/033936 | 3/2011 | | |

OTHER PUBLICATIONS

Korean Office Action (Application No. 2012-7016684) Dated Jul. 4, 2013.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C." Journal of Solid State Chemistry, 1985, vol. 60, pp. 382-384.

Kimizuka et al., "Syntheses and Single-Crystal Data of Homologous Compounds, $In_2O_3(ZnO)_m$ ($m$ = 3, 4, and 5), $InGaO_3(ZnO)_3$, and $Ga_2O_3(ZnO)_m$ ($m$ = 7, 8, 9, and 16) in the $In_2O_3$—$ZnGa_2O_4$—$ZnO$ System," Journal of Solid State Chemistry, Apr. 1, 1995, vol. 116, No. 1, pp. 170-178.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the 9th International Display Workshops, Dec. 4, 2002, pp. 295-298.

Kanno et al., "White Stacked Electrophosphorecent Organic Light-Emitting Device Employing $MoO_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUS on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

(56) References Cited

OTHER PUBLICATIONS

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Ohara et al., "21.3: 4.0 IN. QVGA AMOLED Display Using In—Ga—Zn—Oxide TFTs with a Novel Passivation Layer," SID Digest '09: SID International Symposium Digest of Technical Papers, May 31, 2009, pp. 284-287.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Osada et al., "Development of Driver-Integrated Panel using Amorphous In—Ga—Zn—Oxide TFT," AM-FPD '09 Digest of Technical Papers, Jul. 1, 2009, pp. 33-36.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In. AMOLED Display with Driver Circuit Using Amorphous In—Ga—Zn—Oxide TFTs," IDW '09: Proceedings of the 16th International Display Workshops, 2009, pp. 689-692.

International Search Report (Application No. PCT/JP2010/066118) dated Oct. 19, 2010.

Written Opinion (Application No. PCT/JP2010/066118) dated Oct. 19, 2010.

Fortunato et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Nakamura, "Synthesis of Homologous Compound with New Long-Period Structure," NIRIM Newsletter, Mar. 1, 1995, vol. 150, pp. 1-4.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

(56) References Cited

OTHER PUBLICATIONS

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Cho.D et al., "Local structure and conduction mechanism in amorphous In—G—Zn—O films", Appl. Phys. Lett. (Applied Physics Letters), 2009, vol. 94, pp. 112112-1-112112-3.

Notification (Japanese Application No. 2010-221574) Dated May 20, 2014.

Information Offer Form (Japanese Application No. 2010-221574) Dated Apr. 21, 2014.

Taiwanese Office Action (Application No. 99133701) Dated May 8, 2014.

Taiwanese Office Action (Application No. 101126285) Dated May 8, 2014.

Chinese Office Action (Application No. 201080039662.X) Dated May 6, 2014.

Chinese Office Action (Application No. 201080039662.X) Dated Mar. 9, 2015.

\* cited by examiner

Crystal structure of In$_2$Ga$_2$ZnO$_7$

Vicinity of surface of IGZO film *1

Vicinity of surface of IGZO film *5

← In layer
← In layer

← In layer
← In layer
← In layer
← In layer

| Functional | GGA-PBE |
|---|---|
| Pseudopotential | Ultrasoft type |
| Cutoff energy | 300 eV |
| k point | Crystal structure 8×8×2<br>(001):O 8×8×1<br>(001):In 4×4×1<br>(001):Ga 4×4×1 |

FIG. 13

| Material | Plane struture | Surface energy (J/m$^2$) |
|---|---|---|
| In$_2$Ga$_2$ZnO$_7$ | (001):(Ga,Zn)O | 0.765 |
| | (001):In | 2.29 |
| | (001):Ga,Zn | 1.09 |
| | (100) | 2.16 |
| In$_2$O$_3$ | (001) In outermost surface | 1.77 |
| | (001) O outermost surface | 3.43 |
| Ga$_2$O$_3$ | (001) Ga outermost surface | 1.69 |
| | (001) O outermost surface | 3.69 |
| ZnO | (001) | 2.99 |
| | (100) | 4.53 |
| | (110) | 1.62 |

US 9,306,072 B2

OXIDE SEMICONDUCTOR LAYER AND SEMICONDUCTOR DEVICE

TECHNICAL FIELD

The technical field of the disclosed invention relates to a semiconductor layer including an oxide semiconductor. Alternatively, the technical field of the disclosed invention relates to a semiconductor device using the semiconductor layer.

BACKGROUND ART

A field-effect transistor is one of the most widely-used semiconductor elements. A variety of materials are used for field-effect transistors according to their uses. In particular, semiconductor materials including silicon are frequently used.

The field-effect transistor using silicon has characteristics satisfying the needs with respect to a variety of uses. For example, single crystal silicon is used for an integrated circuit or the like which needs to be operated at a high speed, whereby the need with respect to the integrated circuit is satisfied. Further, amorphous silicon is used for an object which needs a large area, such as a display device, whereby the need with respect to the object can be satisfied.

As described above, silicon is highly versatile and can be used for various purposes. However, in recent years, semiconductor materials tend to be expected to have higher performance as well as versatility. For example, in terms of improving performance of a large-area display device, in order to realize high-speed operation of a switching element, a semiconductor material which facilitates increase of the area of a display device and has higher performance than amorphous silicon is needed.

Under such conditions, a technique relating to a field-effect transistor (also called an FET) using an oxide semiconductor has attracted attention. For example, in Patent Document 1, a transparent thin film field-effect transistor using a homologous compound $InMO_3(ZnO)_m$ (M is In, Fe, Ga, or Al, and m is an integer number of greater than or equal to 1 and less than 50) is disclosed.

In addition, in Patent Document 2, a field-effect transistor is disclosed in which an amorphous oxide semiconductor whose electron carrier concentration is less than $10^{18}/cm^3$ and which contains In, Ga, and Zn is used. Note that in Patent Document 2, the ratio of In:Ga:Zn equals to 1:1:m (m<6) in the amorphous oxide semiconductor.

Further, in Patent Document 3, a field-effect transistor is disclosed in which an amorphous oxide semiconductor including a microcrystal is used for an active layer.

REFERENCE

Patent Document

[Patent Document 1] Japanese Published Patent Application No. 2004-103957
[Patent Document 2] PCT International Publication No. 05/088726
[Patent Document 3] Japanese Published Patent Application No. 2006-165529

DISCLOSURE OF INVENTION

In Patent Document 3, a disclosure is given in which a composition in a crystal state is $InGaO_3(ZnO)_m$ (m is an integer number of less than 6). Further, in Example 1 of Patent Document 3, a case of $InGaO_3(ZnO)_4$ is disclosed. However, in the real condition, adequate characteristics have not been obtained even when such oxide semiconductors are used.

In view of the foregoing problem, it is an object to provide an oxide semiconductor layer having a novel structure which is preferably used for a semiconductor device. Alternatively, it is another object to provide a semiconductor device using an oxide semiconductor layer having the novel structure.

In the disclosed invention, an oxide semiconductor layer having a predetermined crystal structure in a vicinity of the surface is provided. Alternatively, a semiconductor device including the oxide semiconductor layer is provided. As an example of the predetermined crystal structure, a crystal structure having electrical anisotropy is given. Alternatively, a crystal structure having a function of suppressing the entry of impurities is given.

It is preferable that in the oxide semiconductor layer, a region other than the above crystal structure be mainly amorphous. Note that a "vicinity of a surface (surface vicinity)" means, for example, a region in which a distance (depth) from the surface is 20 nm or less. In addition, "mainly" means a state where one occupies 50% or more, for example. As examples of means to solve the problem, the following can be given.

One embodiment of the disclosed invention is an oxide semiconductor layer including an amorphous region which mainly contains an amorphous oxide semiconductor containing In, Ga, and Zn and a crystal region containing crystal grains of $In_2Ga_2ZnO_7$ in a vicinity of a surface of the oxide semiconductor layer. The crystal grains are oriented so that the c-axis is almost vertical with respect to the surface. Note that almost vertical means a state within ±10° from a vertical direction.

In the above, the crystal grains of $In_2Ga_2ZnO_7$ preferably has a stacked-layer structure of a first layer containing In, a second layer without In, a third layer without In, a fourth layer containing In, a fifth layer without In. Further, one of a 5s orbital of In is preferably overlapped with an adjacent 5s orbital of In in the first layer containing In or the fourth layer containing In.

In the above amorphous region, a Zn content (atomic %) is preferably less than an In content or a Ga content (atomic %). In addition, the length (size) of the crystal grains in a c-axis direction is preferably less than five times as long as the length (size) thereof in an a-axis direction or a b-axis direction.

Another embodiment of the disclosed invention is a semiconductor device including a gate electrode layer, a gate insulating layer over the gate electrode layer, a semiconductor layer over the gate insulating layer, and a source electrode layer and a drain electrode layer which are electrically connected to part of the semiconductor layer. The above oxide semiconductor layer is applied to the semiconductor layer.

Another embodiment of the disclosed invention is a semiconductor device including a semiconductor layer, a gate insulating layer over the semiconductor layer, a gate electrode layer over the gate insulating layer, and a source electrode layer and a drain electrode layer which are electrically connected to part of the semiconductor layer. The above oxide semiconductor layer is applied to the semiconductor layer.

The above semiconductor device preferably includes an insulating layer covering the semiconductor layer. Further, the source electrode layer or the drain electrode layer, and the semiconductor layer are electrically connected to each other on an upper surface or a lower surface of the semiconductor layer.

Note that in this specification and the like, terms such as "over" and "below" are not limited to being directly above or directly below. For example, the expression of "a gate insulating layer over a gate electrode layer" does not exclude the case where another component is interposed between the gate electrode layer and the gate insulating layer. In addition, "over" and "below" are used only for convenience of the description. Unless otherwise specified, the case where the positions thereof are interchanged is included.

Electric characteristics of an oxide semiconductor layer which employs a crystal structure having electrical anisotropy in a vicinity of a surface is changed in comparison with those of an oxide semiconductor layer which does not employ the crystal structure. For example, conductivity in a direction parallel to the surface of the oxide semiconductor layer is improved, and an insulating property in a direction vertical to the surface of the oxide semiconductor layer is improved.

In addition, in an oxide semiconductor layer which employs a crystal structure having a function of suppressing the entry of impurities into a vicinity of the surface, the entry of impurities is suppressed in comparison with an oxide semiconductor layer which does not employ the crystal structure. For example, the entry of water, hydrogen, and the like which adversely affect an oxide semiconductor is suppressed.

Therefore, according to one embodiment of the disclosed invention, an oxide semiconductor layer having excellent electric characteristics is provided. In addition, a highly reliable oxide semiconductor layer is provided.

According to another embodiment of the disclosed invention, a semiconductor device having excellent characteristics is provided. In addition, a highly reliable semiconductor device is provided.

BRIEF DESCRIPTION OF DRAWINGS

In the accompanying drawings:

FIGS. 6A-1 to 6A-3 and 6B-1 to 6B-3 are diagrams for comparing actual measurement data and simulation results of electron diffraction patterns;

FIGS. 8A-1, 8A-2, 8B-1, and 8B-2 show simulation results of HAADF-STEM images;

FIG. 12 shows details of calculation conditions;

FIG. 13 shows calculation results of surface energy;

BEST MODE FOR CARRYING OUT THE INVENTION

Figure 1A:
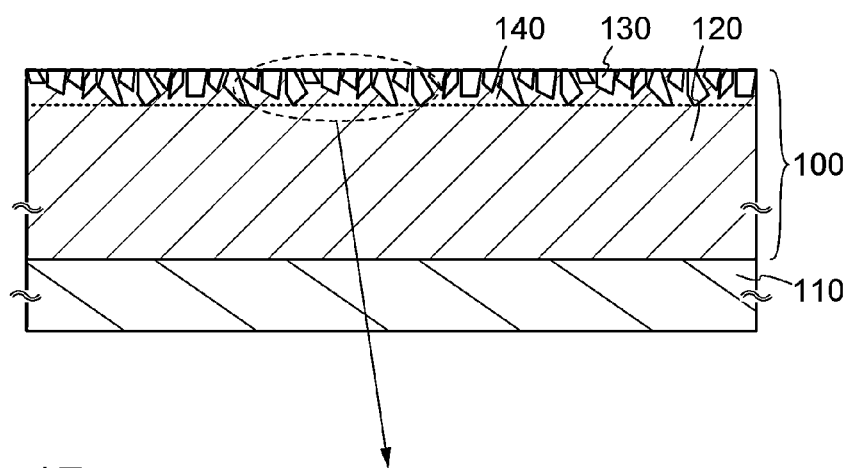
FIGS. 1A and 1B are cross-sectional views illustrating a structure of an oxide semiconductor layer.

Hereinafter, embodiments will be described in detail using the drawings. Note that the present invention is not limited to the description of the following embodiments, and it is apparent to those skilled in the art that modes and details can be modified in various ways without departing from the spirit of the present invention disclosed in this specification and the like. Structures of different embodiments can be implemented in an appropriate combination. Note that in the structures of the invention described below, the same portions or portions having a similar function are denoted by the same reference numerals, and the description thereof is omitted.

(Embodiment 1)

In this embodiment, an oxide semiconductor layer according to one embodiment of the disclosed invention, a manufacturing method thereof, and the like will be described in detail with reference to FIGS. 1A and 1B, FIG. 2, FIGS. 3A to 3C, FIGS. 4A and 4B, FIGS. 5A-1 to 5A-6 and 5B, FIGS. 6A-1 to 6A-3 and 6B-1 to 6B-3, FIGS. 7A and 7B, FIGS. 8A-1, 8A-2, 8B-1, and 8B-2, FIG. 9, FIG. 10, FIGS. 11A to 11D, FIG. 12, FIG. 13, and FIGS. 14A to 14C.

<Structure of Oxide Semiconductor Layer>

First, a structure of an oxide semiconductor layer is described with reference to FIGS. 1A and 1B and FIG. 2.

Figure 1B:
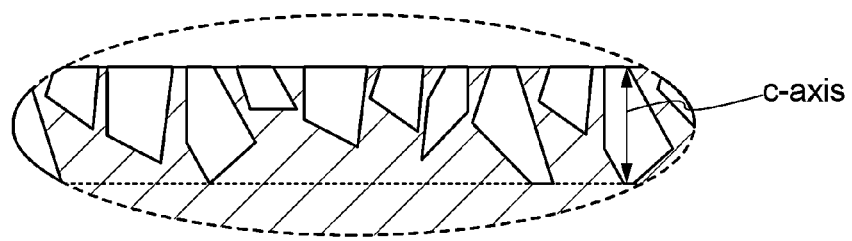

FIGS. 1A and 1B show an example where an oxide semiconductor layer 100 is provided on a surface on which a base material 110 is to be formed. Note that any material may be used for the base material 110 as long as it can support the oxide semiconductor layer 100. The oxide semiconductor layer 100 is not limited to being provided on the surface on which the base material 110 is to be formed and may be a self-supported layer.

The oxide semiconductor layer 100 includes an amorphous region 120 mainly formed with an amorphous oxide semiconductor and a crystal region 140 including crystal grains 130 in a vicinity of a surface of the oxide semiconductor layer 100 (see FIG. 1A). The crystal grains 130 are oriented so that the c-axis is almost vertical with respect to the surface of the oxide semiconductor layer 100. Here, "almost vertical" means a state within ±10° from a vertical direction.

As examples of an oxide semiconductor material for forming the oxide semiconductor layer 100, an In—Ga—Zn—O-based oxide semiconductor material, an In—Sn—Zn—O-based oxide semiconductor material, an In—Al—Zn—O- based oxide semiconductor material, a Sn—Ga—Zn—O-based oxide semiconductor material, an Al—Ga—Zn—O-based oxide semiconductor material, a Sn—Al—Zn—O-based oxide semiconductor material, an In—Zn—O-based oxide semiconductor material, a Sn—Zn—O-based oxide semiconductor material, an Al—Zn—O-based oxide semiconductor material, an In—O-based oxide semiconductor material, a Sn—O-based oxide semiconductor material, and a Zn—O-based oxide semiconductor material are given.

In particular, an In—Ga—Zn—O-based oxide semiconductor material has sufficiently high resistance when there is no electric field and thus off current can be sufficiently reduced. In addition, with high field-effect mobility, the In—Ga—Zn—O-based oxide semiconductor material is suitable for a semiconductor device.

As a typical example of the In—Ga—Zn—O-based oxide semiconductor material, one represented by $InGaO_3 (ZnO)_m$ (m>0) is given. Note that a composition according to this representation is based on a crystal structure and is not limited to the above composition as the whole oxide semiconductor material. Alternatively, in the above, one represented by $InMO_3(ZnO)_m$ (m>0) can be also given using M instead of Ga. Here, M denotes one or more of metal elements selected from gallium (Ga), iron (Fe), nickel (Ni), manganese (Mn), cobalt (Co), and the like. Ga is selected as M in the In—Ga—Zn—O-based oxide semiconductor material and the case where the above metal element other than Ga is selected, such as a combination of Ga and Ni or a combination of Ga and Fe, as well as the case where only Ga is used is included. In some cases, the In—Ga—Zn—O-based oxide semiconductor material may contain impurities such as a transition metal element and an oxide thereof in addition to a metal element contained as M.

The amorphous region 120 mainly contains an amorphous oxide semiconductor. Note that "mainly" means a state where one occupies 50% or more, for example. In this case, it is a state where the amorphous oxide semiconductor occupies 50% or more at volume % (or weight %). That is, other than an amorphous oxide semiconductor, the amorphous region 120 includes crystals of an oxide semiconductor in some cases, and the percentage of content thereof is preferably less than 50% at volume % (or weight %). Note that it can be said that an essence of the disclosed invention is the structure of the crystal region 140; therefore, the structure of the amorphous region 120 is not necessarily limited to the above structure as long as required characteristics can be obtained.

In the case where the In—Ga—Zn—O-based oxide semiconductor material is used, the composition of the above amorphous region 120 is preferably set so that a Zn content (atomic %) is less than an In or Ga content (atomic %). With the use of such a composition, the crystal grains 130 of a predetermined composition are easily formed in the crystal region 140.

The crystal region 140 in the vicinity of the surface includes the crystal grains 130 in which c-axis is oriented in an almost vertical direction with respect to the surface of the oxide semiconductor layer 100 (see FIG. 1B). For example, in the case of using an In—Ga—Zn—O-based oxide semiconductor material, in the crystal region 140, the c-axis of the crystal grains of $In_2Ga_2ZnO_7$ is oriented in an almost vertical direction with respect to the surface of the oxide semiconductor layer 100. Note that a "vicinity of a surface (surface vicinity)" means, for example, a region in which a distance (depth) from the surface is 20 nm or less. Note that the case where the thickness of the oxide semiconductor layer 100 is large is not limited to this. For example, in the case where the oxide semiconductor layer 100 has a thickness of 200 nm or more, a "vicinity of a surface (surface vicinity)" means a region in which a distance (depth) from the surface is 10% or lower of the thickness of the oxide semiconductor layer.

Figure 2:
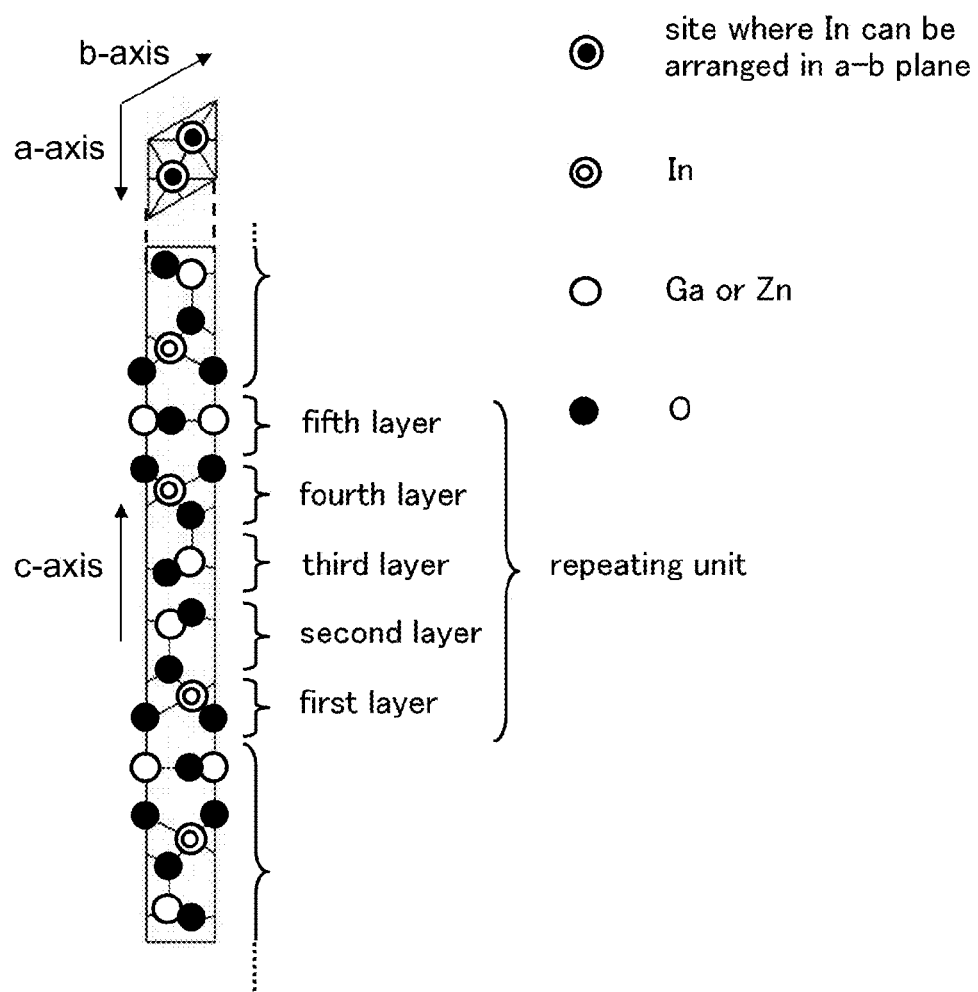
FIG. 2 is a diagram illustrating a crystal structure of $In_2Ga_2ZnO_7$.

The crystals of $In_2Ga_2ZnO_7$ include any of In, Ga, and Zn, and can be considered to have a stacked-layer structure of layers parallel to a-axis and b-axis (see FIG. 2). That is, the crystals of $In_2Ga_2ZnO_7$ have a structure in which a first layer containing In, a second layer without In (containing Ga or Zn), a third layer without In (containing Ga or Zn), a fourth layer containing In, and a fifth layer without In (containing Ga or Zn) are stacked in a c-axis direction.

Since electrical conductivity of the crystals of $In_2Ga_2ZnO_7$ are controlled mainly by In, electric characteristics of the first layer containing In and the fourth layer containing In which is related to a direction parallel to the a-axis and the b-axis are preferable. This is because one of a 5s orbital of In is overlapped with an adjacent 5s orbital of In in the first layer containing In or the fourth layer containing In, so that a carrier path is formed. On the other hand, it can be said that an insulating property in a direction vertical to the above layer (that is, the c-axis direction) is increased.

When such crystal grains having electrical anisotropy are oriented, an effect on electric characteristics of the oxide semiconductor layer 100 also arises. Specifically, for example, electric characteristics in a direction parallel to the surface of the oxide semiconductor layer 100 are increased. This is because the c-axis of the crystal grains of $In_2Ga_2ZnO_7$ is oriented in an almost vertical direction with respect to the surface of the oxide semiconductor layer 100, and current flows in a direction parallel to the a-axis and the b-axis in $In_2Ga_2ZnO_7$ crystals.

Note that the crystal region 140 may include crystal grains other than the crystal grains 130. The crystal structure of the crystal grains is not limited to the above structure, and the crystal region 140 may include crystal grains of another structure. For example, in the case of using an In—Ga—Zn—O-based oxide semiconductor material, crystal grains of $InGaZnO_4$ may be included in addition to crystal grains of $In_2Ga_2ZnO_7$. Needless to say, the case where crystal grains of $In_2Ga_2ZnO_7$ exist in the whole crystal region 140 is more effective and more preferable.

The length (size) of the crystal grains in a c-axis direction is preferably less than five times as long as the length (size) in an a-axis direction or a b-axis direction, more preferably less than three times. This is because when the thickness of the crystal region 140 is too large (that is, when the length of the crystal grains 130 in a c-axis direction is too long), there is a possibility that characteristics of the oxide semiconductor layer 100 may depend only on the crystal region 140 and desired characteristics cannot be obtained.

As described above, when the oxide semiconductor layer 100 has the crystal region 140 in the vicinity of the surface, favorable electric characteristics can be achieved. In particular, when the crystal region 140 is formed so as to include the crystal grains of $In_2Ga_2ZnO_7$ whose c-axis is oriented in an almost vertical direction with respect to the surface of the oxide semiconductor layer 100, excellent electric characteristics can be realized by anisotropy in electric characteristics of the crystal grains of $In_2Ga_2ZnO_7$.

Further, the crystal region 140 is more stable than the amorphous region 120; therefore, when the crystal region 140 is included in the vicinity of the surface of the oxide semiconductor layer 100, the entry of impurities (e.g., moisture and the like) into the amorphous region 120 can be suppressed. Thus, the reliability of the oxide semiconductor layer 100 can be increased.

<Method for Manufacturing Oxide Semiconductor Layer>

Figure 3A:
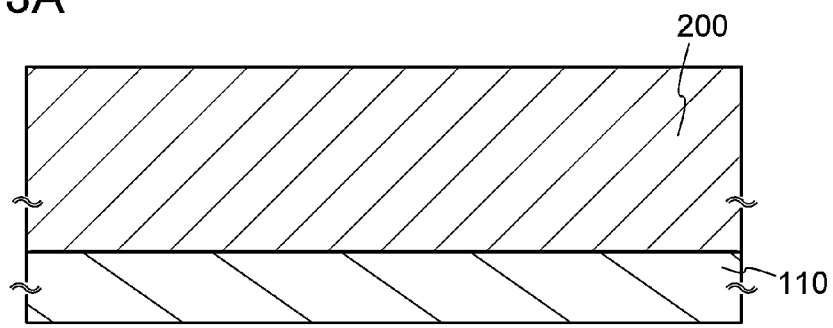
FIGS. 3A to 3C are cross-sectional views illustrating a method for manufacturing an oxide semiconductor layer.

Next, a method for manufacturing the oxide semiconductor layer 100 will be described with reference to FIGS. 3A to 3C.

An oxide semiconductor layer 200 which is to be the oxide semiconductor layer 100 later is formed using the oxide semiconductor material described in <Structure of Oxide Semiconductor Layer>. The oxide semiconductor layer 200 is formed by a sputtering method or the like under an atmosphere of a rare gas such as argon, under an oxygen atmosphere, or a mixed atmosphere of a rare gas and oxygen (see FIG. 3A). When a target including $SiO_2$ at 2 weight % to 10 weight % inclusive is used in a sputtering method, $SiO_x$ (x>0) is included in the oxide semiconductor layer 200, so that crystallization of the oxide semiconductor layer 200 can be suppressed. This method is particularly effective in the case where the oxide semiconductor layer 200 which is amorphous is desired to be obtained.

For example, an In—Ga—Zn—O-based amorphous oxide semiconductor layer can be obtained as the oxide semiconductor layer 200 using a metal oxide target containing In, Ga, and Zn (such as a target having a composition ratio of In:Ga:Zn=1:1:0.5 [atom %], In:Ga:Zn=1:1:1 [atom %], and In:Ga:Zn=1:1:2 [atom %]) under the following conditions: the distance between the substrate and the target is 100 mm; the pressure is 0.6 Pa; the direct current power is 0.5 kW; and the atmosphere is an oxygen atmosphere (the proportion of the oxygen flow is 100%). Note that the case where a pulse direct current power source is used as a power source is preferable because powder substances (also referred to as particles or dust) generated in film formation can be reduced and thickness distribution can be evened.

The thickness of the oxide semiconductor layer 200 can be set as appropriate in accordance with an objective purpose or objective characteristics. For example, it may be approximately 20 nm to 10 μm.

Figure 3B:
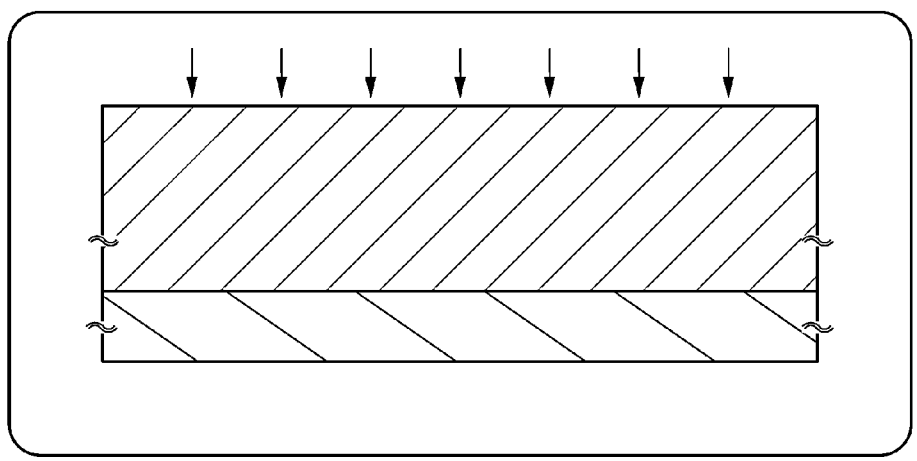

The crystal region 140 is formed through heat treatment after the oxide semiconductor layer 200 is formed (see FIG. 3B). Note that since $H_2$, H, OH, and the like in the oxide semiconductor layer 200 are eliminated through the heat treatment, the heat treatment can be called dehydration treatment or dehydrogenation treatment.

Rapid thermal anneal (RTA) treatment in which a high-temperature inert gas (a nitrogen gas, a rare gas, or the like) is used can be employed as the above heat treatment. Here, the temperature of the heat treatment is preferably 500° C. or higher. Note that there is no requirement for the upper limit of the heat treatment temperature from an essential part of the invention; however, it is required to be in the range of allowable temperature limit when the base material 110 is used as a support. The length of the heat treatment is preferably greater than or equal to 1 minute and less than or equal to 10 minutes. For example, RTA treatment is preferably performed at 650° C. for approximately 3 minutes to 6 minutes. By employing the RTA treatment, heat treatment can be performed for a short time; therefore, adverse effect of heat on the base material 110 can be reduced. That is, the upper limit of the heat treatment temperature can be increased in this case as compared with the case where heat treatment is performed for a long time. Further, the crystal grains of a predetermined structure can be selectively formed in the vicinity of the surface.

Note that the above heat treatment may be performed at any timing as long as it is performed after the oxide semiconductor layer 200 is formed; however, in order to promote dehydration or dehydrogenation, the heat treatment is preferably performed before other components are formed on a surface of the oxide semiconductor layer 200. In addition, the heat treatment may be performed plural times instead of once.

Note that it is preferable that in the above heat treatment, hydrogen (including water) and the like be not contained in the treatment atmosphere. For example, the purity of an inert gas which is introduced into a heat treatment apparatus is set to 6N (99.9999%, that is, an impurity concentration is 1 ppm or lower) or more, preferably, 7N (99.99999%, that is, an impurity concentration is 0.1 ppm or lower) or more.

Figure 3C:
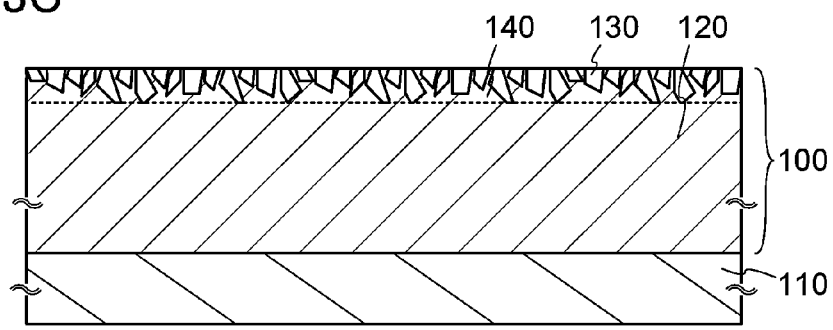

Through the above heat treatment, the oxide semiconductor layer 100 which includes the amorphous region 120 which is mainly amorphous and the crystal region 140 including the crystal grains 130 which is oriented so that the c-axis is almost vertical with respect to the surface of the oxide semiconductor layer is formed (see FIG. 3C).

Note that the above crystal region 140 has a function of suppressing the entry of impurities into a film; however, when a large number of impurities exist, it is difficult to suppress the entry completely. Therefore, it is important that the oxide semiconductor layer 100 be not made in contact with water, hydrogen, and the like after the above heat treatment as much as possible. This can be achieved in such a manner that the substrate is not exposed to the atmosphere in the heat treatment and a following temperature decreasing process. For example, the heat treatment and the following temperature decreasing process may be performed in one atmosphere. It is needless to say that the atmosphere in the temperature decreasing process may be different from the heat treatment atmosphere. In this case, the atmosphere in the temperature decreasing process can be, for example, an oxygen gas atmosphere, an $N_2O$ gas atmosphere, an ultra-dry air (having a dew point of −40° C. or lower, preferably, −60° C. or lower), or the like.

<About Growth Mechanism of Crystal Grains>

An example of a growth mechanism of crystal grains in an In—Ga—Zn—O-based amorphous oxide semiconductor layer will be described below with reference to FIGS. 4A and 4B, FIGS. 5A-1 to 5A-6 and 5B, FIGS. 6A-1 to 6A-3 and 6B-1 to 6B-3, FIGS. 7A and 7B, FIGS. 8A-1, 8A-2, 8B-1, and 8B-2, FIG. 9, FIG. 10, FIGS. 11A to 11D, FIG. 12, FIG. 13, and FIGS. 14A to 14C.

First, a state where the crystal grains of $In_2Ga_2ZnO_7$ are c-axis-oriented in the vicinity of the surface of the In—Ga—Zn—O-based amorphous oxide semiconductor layer is shown together with results of experimental observation.

As the In—Ga—Zn—O-based amorphous oxide semiconductor layer, a film which is formed with a thickness of 50 nm over the glass substrate by a DC sputtering method is used. In addition, as a sputtering target, a target having a composition ratio of In:Ga:Zn=1:1:0.5 [atom %] was used. Other deposition conditions were as follows: the direct current power was 0.5 kW; the deposition pressure was 0.6 Pa; the deposition atmosphere was an oxygen atmosphere (the proportion of the oxygen flow is 100%); and the substrate temperature was room temperature.

The In—Ga—Zn—O-based amorphous oxide semiconductor layer was subjected to RTA treatment so that the crystal grains of $In_2Ga_2ZnO_7$ were c-axis-oriented in the vicinity of the surface. The heat treatment conditions were as follows: the atmosphere was a nitrogen atmosphere under atmospheric pressure; the temperature was 650° C.; and the time was set to 6 minutes.

In order to observe a cross section of the sample formed in such a manner, reduction in thickness by an Ar ion milling method (acceleration voltage: 5 kV) or a reduction in thickness by an FIB milling method (irradiation ion: Ga, acceleration voltage: processing at 5 kV after processing at 40 kV)

was performed after mechanical polishing. Note that PIPS manufactured by Gatan, Inc. was used in an Ar ion milling method and NB-5000 and FB-2100 manufactured by Hitachi, Ltd. was used in an FIB milling method.

Figure 4A:
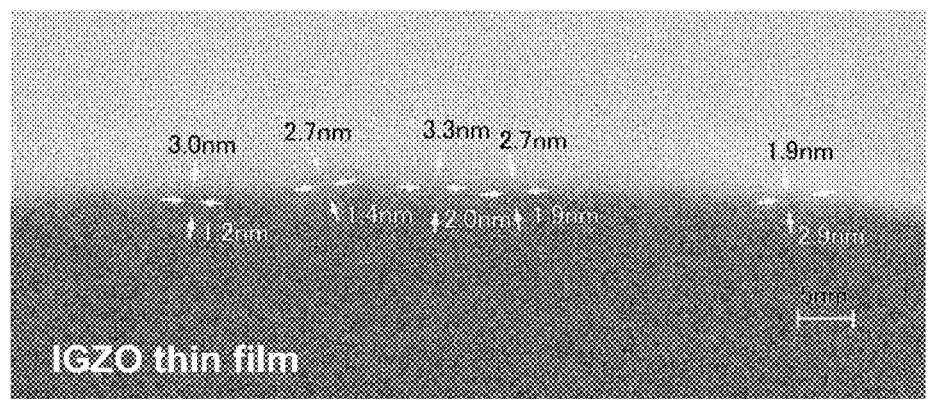
FIGS. 4A and 4B are bright-field-TEM images of a vicinity of a surface.
Figure 4B:
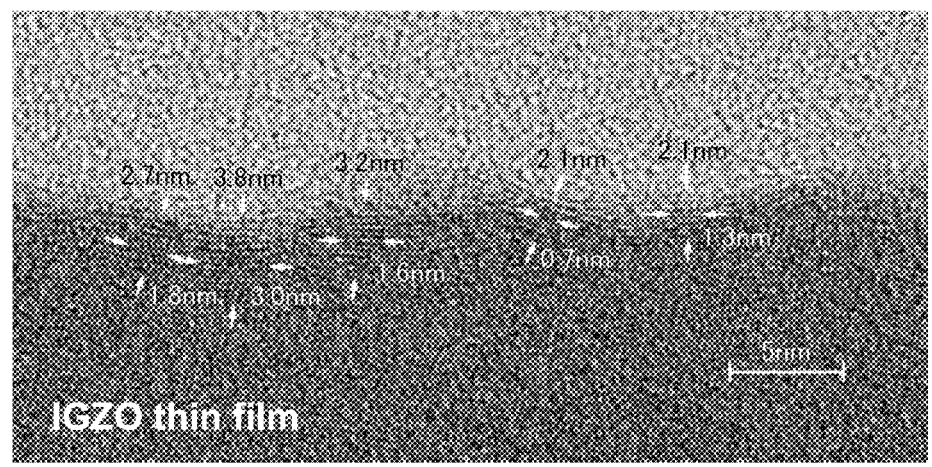

FIGS. 4A and 4B are bright-field-TEM images of the vicinity of the surface of the sample. Note that the TEM images are images which are observed under a condition in which the acceleration voltage was 300 kV using H-9000NAR manufactured by Hitachi, Ltd. In FIGS. 4A and 4B, it can be observed that a crystal region including crystal grains with a width of 1 nm to 3 nm inclusive and a depth of 2 nm to 4 nm inclusive is formed in the vicinity of the surface of an In—Ga—Zn—O-based oxide semiconductor layer with a thickness of 50 nm.

Figures 1, 5A:
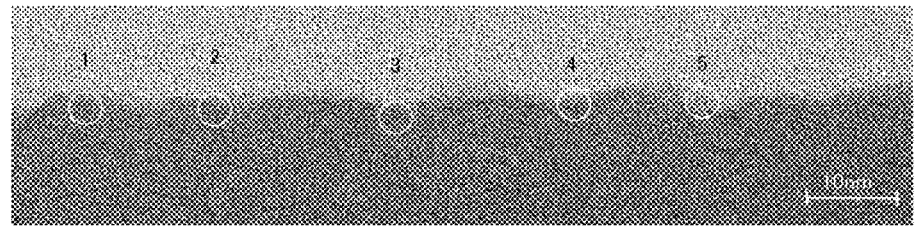
FIGS. 5A-1 to 5A-6 and 5B are electron diffraction patterns of a vicinity of a surface and cross-sectional TEM images illustrating measurement points.
Figures 2, 5A:
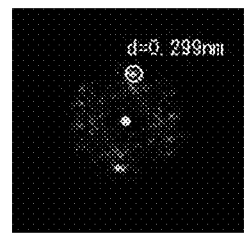
Figures 4, 5A:
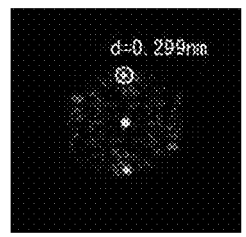
Figures 5, 5A, 6:
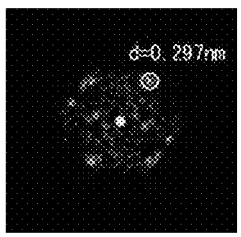
Figures 3, 5A:
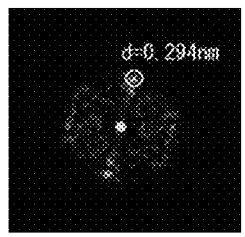
Figures 5, 5A:
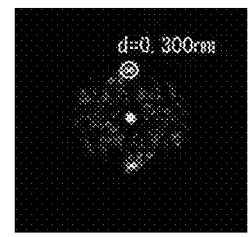

FIG. 5A-1 is a cross-sectional TEM image of the vicinity of the surface of the sample. FIG. 5A-2 is an electron diffraction pattern corresponding to reference numeral 1 in the cross-sectional TEM image. FIG. 5A-3 is an electron diffraction pattern corresponding to reference numeral 2 in the cross-sectional TEM image. FIG. 5A-4 is an electron diffraction pattern corresponding to reference numeral 3 in the cross-sectional TEM image. FIG. 5A-5 is an electron diffraction pattern corresponding to reference numeral 4 in the cross-sectional TEM image. FIG. 5A-6 is an electron diffraction pattern corresponding to reference numeral 5 in the cross-sectional TEM image. In each of the electron diffraction patterns, an obvious spot in which d value is 0.29 nm to 0.30 nm inclusive is shown. A direction of the spots corresponds to the c-axis direction of the crystal.

Figure 5B:
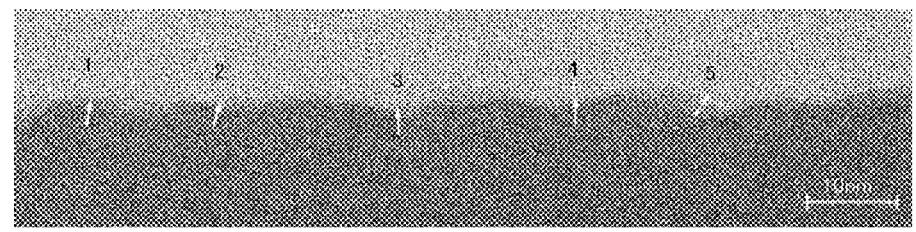

FIG. 5B is a cross-sectional TEM image which shows a relation of the c-axis direction and the surface. Arrows in the drawing indicates the c-axis direction of the crystal grains at each point. From FIG. 5B, it is found that the c-axis (<001> direction) is almost vertical with respect to the surface. It is also found that the c-axis direction reflects flatness of the surface.

Figures 1, 6A:
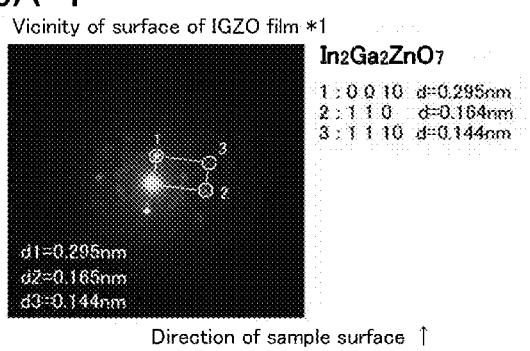
Figures 2, 6A:
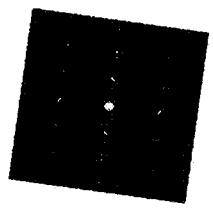
Figures 3, 6A:
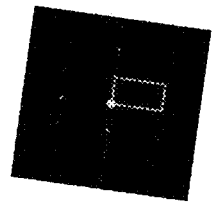
Figures 1, 6B:
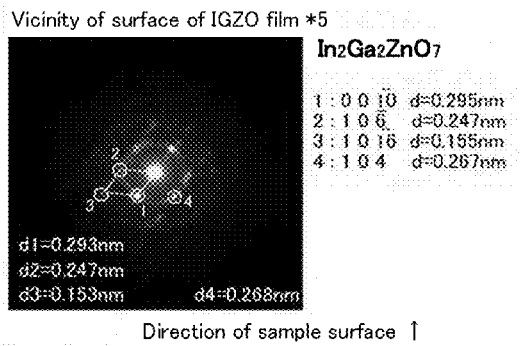
Figures 2, 6B:
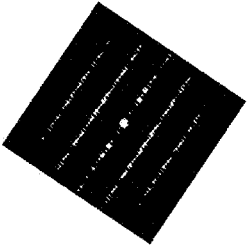
Figures 3, 6B:
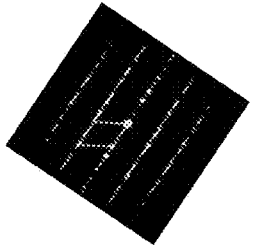

Next, a detailed analysis of the electron diffraction patterns was conducted to determine crystal structures of the crystal grains. FIGS. 6A-1 to 6A-3 show typical actual measurement data of the electron diffraction patterns and FIGS. 6B-1 to 6B-3 show simulation results (assuming $In_2Ga_2ZnO_7$ crystals) corresponding to the actual measurement data. By comparison of the actual measurement data and the simulation results, the crystal structure of the crystal grains can be confirmed to be $In_2Ga_2ZnO_7$.

Figure 7A:
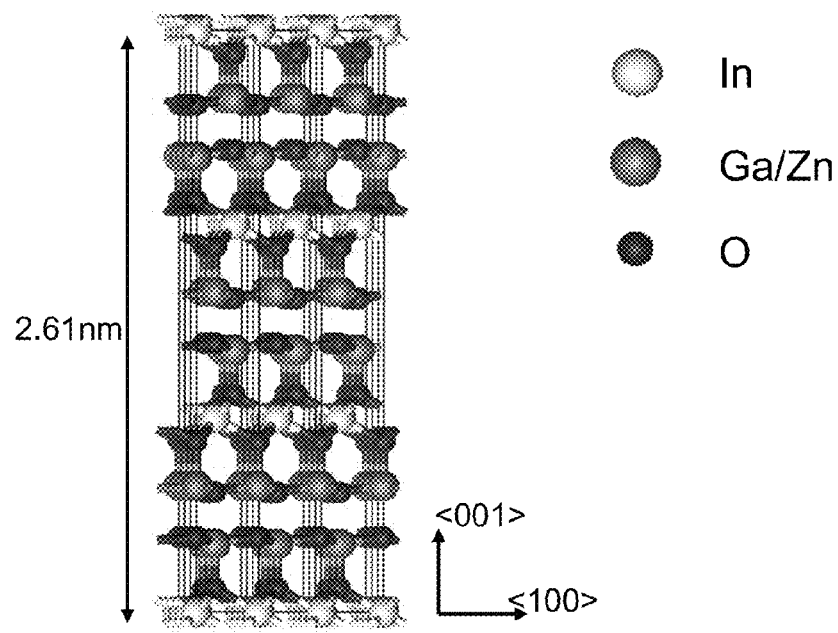
FIGS. 7A and 7B are diagrams for comparing a crystal structure of $InGaZnO_4$ and a crystal structure of $In_2Ga_2ZnO_7$.
Figure 7B:
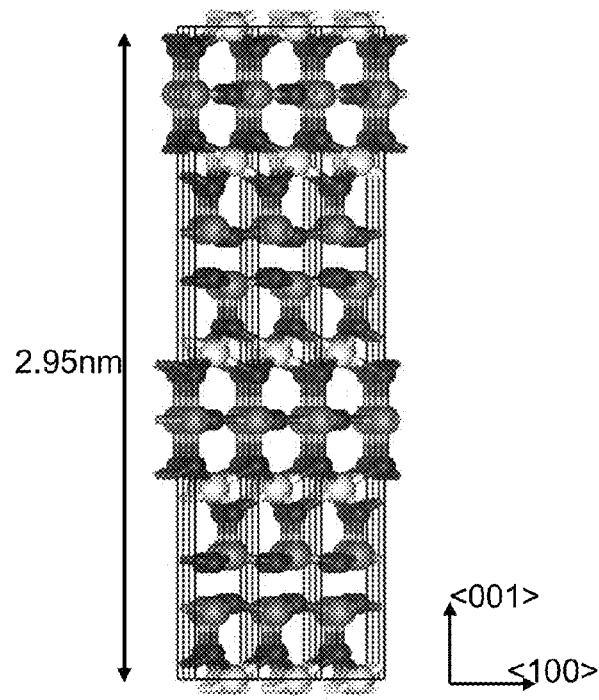

In FIGS. 7A and 7B, comparison of a crystal structure ($InGaZnO_4$) in which m is 1 in a homologous structure of $InGaO_3(ZnO)_m$ (m is a natural number) (see FIG. 7A) and a crystal structure of $In_2Ga_2ZnO_7$ (see FIG. 7B) is shown.

In the structure of $InGaZnO_4$, two layers of GaO or ZnO exist between layers of In and O (InO layers) which are vertical with respect to the c-axis (<001> direction). On the other hand, in the structure of $In_2Ga_2ZnO_7$, one layer and two layers of GaO or ZnO exist alternately and repeatedly between InO layers. A lattice constant in the c-axis direction of $InGaZnO_4$ is 2.61 nm, and that of $In_2Ga_2ZnO_7$ is 2.95 nm.

Figures 1, 8A:
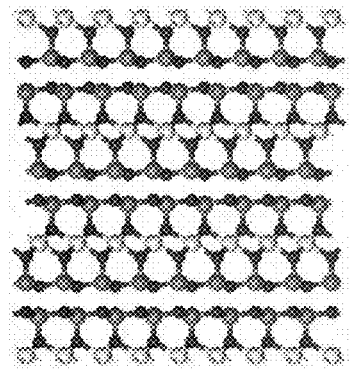
Figures 2, 8A:
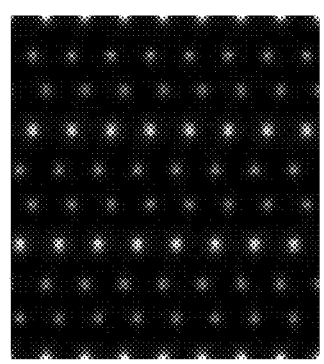
Figures 1, 8B:
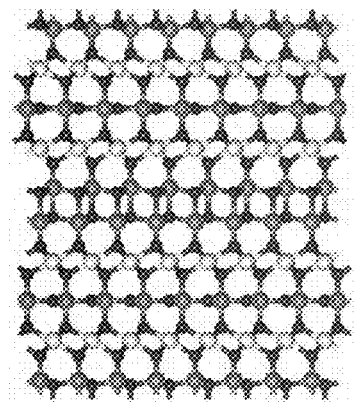
Figures 2, 8B:
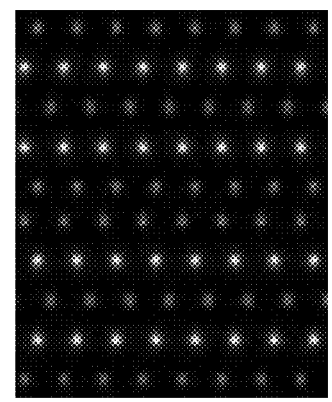

Next, observation of HAADF (high-angle annular dark field)-STEM images in the crystal structure of $InGaZnO_4$ and the crystal structure of $In_2Ga_2ZnO_7$ is described. FIG. 8A-1 shows simulation results of the crystal structure of $InGaZnO_4$ and FIG. 8A-2 is a HAADF-STEM image of the crystal structure of $InGaZnO_4$. FIG. 8B-1 shows simulation results of the crystal structure of $In_2Ga_2ZnO_7$ and FIG. 8B-2 is a HAADF-STEM image of the crystal structure of $In_2Ga_2ZnO_7$. Note that FIG. 8A-1 and FIG. 8B-1 each show the crystal structure seen from a (100) plane.

In a HAADF-STEM image, a contrast proportional to the square of an atomic number is obtained; therefore, the brighter dot indicates the heavier atom. That is, in the above four-component structure, brighter dots represent In atoms and darker dots represent Ga or Zn atoms. In addition, O atoms do not appear as images because they are smaller in mass than the above atoms. Thus, a HAADF-STEM image is an innovative observation method in terms that a structure at the atomic level can be imaged easily and directly.

Figure 9:
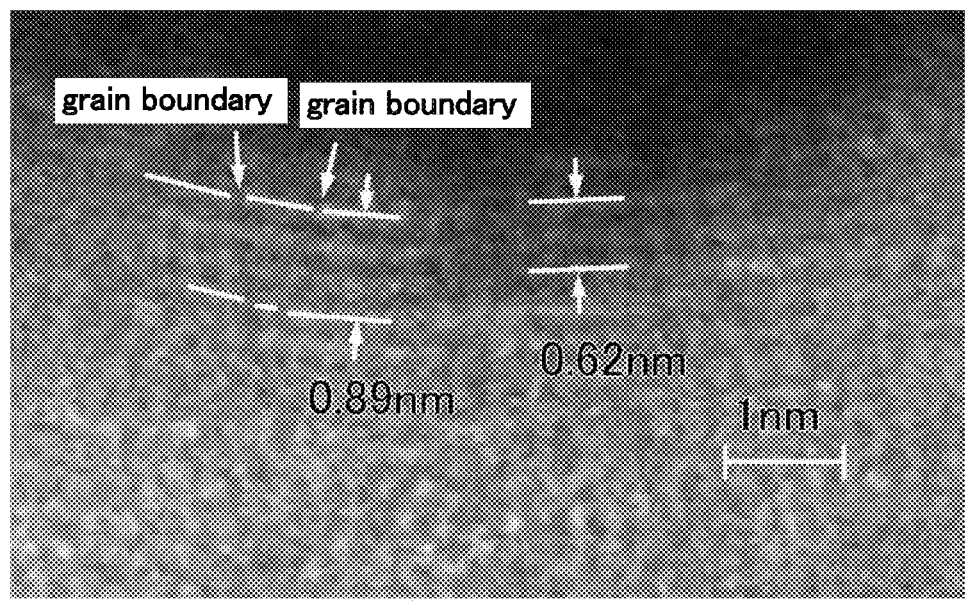
FIG. 9 is a HAADF-STEM image of a cross section of crystal grains of $In_2Ga_2ZnO_7$.
Figure 10:
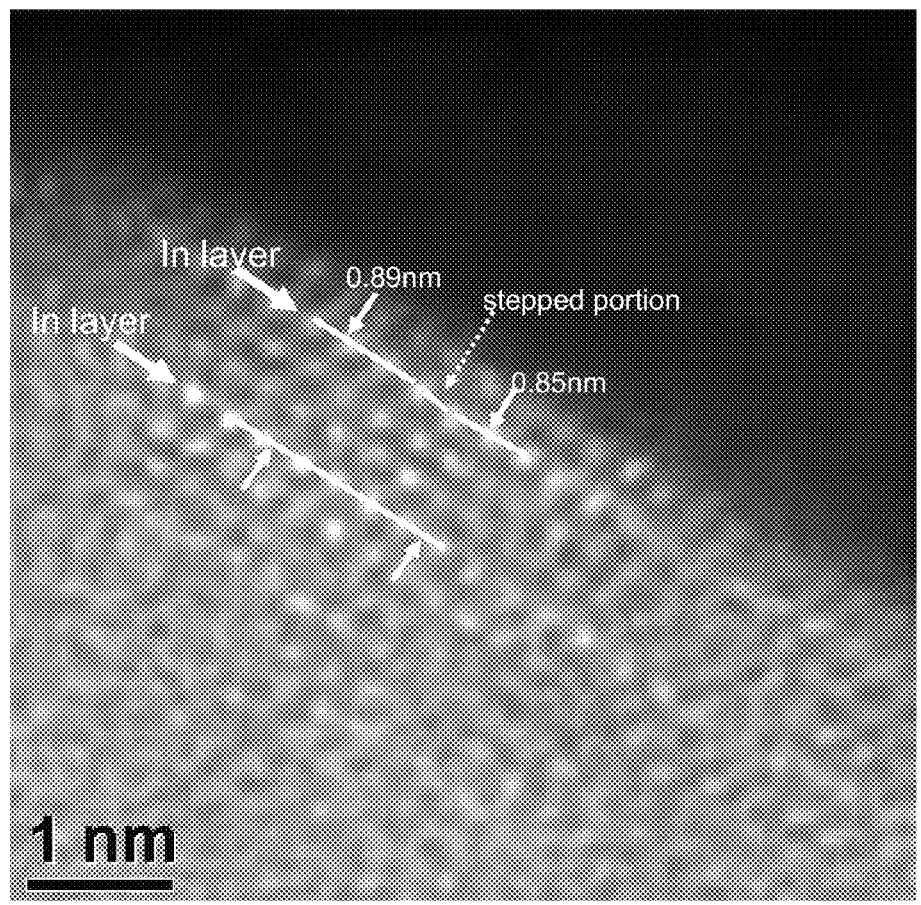
FIG. 10 is a HAADF-STEM image of a cross section of crystal grains of $In_2Ga_2ZnO_7$.

HAADF-STEM images of a cross section of the crystal grains of $In_2Ga_2ZnO_7$ in the vicinity of the surface of the sample are shown in FIG. 9 and FIG. 10. For the observation, a Schottky field emission STEM with a spherical aberration correcting function (HD-2700 manufactured by Hitachi, Ltd., spherical aberration Cs: 5 μm or less) was used. The acceleration voltage was set to 200 kV and the detection angle was set to greater than or equal to 40 mrad and less than or equal to 210 mrad. In FIG. 9 and FIG. 10, intensity difference between In atoms, and Ga atoms or Zn atoms is not obvious unlike in FIGS. 8A-1, 8A-2, 8B-1, and 8B-2. This is considered to be due to the fact that sufficient signal intensity cannot be obtained because the crystal grains are minute.

When FIG. 9 is observed in detail, a structure in which two layers containing Ga or Zn exist between layers containing In (the distance between the layers containing In: 0.89 nm) and a structure in which one layer containing Ga or Zn exist between the layers containing In (the distance between the layers containing In: 0.62 nm) can be confirmed. In FIG. 10, a more characteristic structure can be confirmed. An outermost surface layer does not contain In in most of the region. This indicates that the outermost surface is a layer containing Ga or Zn. This is an interesting fact to understand a formation mechanism of the crystal grains.

Next, based on the above observation results, a formation mechanism of crystal nuclei and a growth mechanism of the crystals in the vicinity of a surface of the oxide semiconductor layer were confirmed by computer calculation.

In order to examine the plane orientation of a seed crystal related to crystal growth, surface energy of $In_2Ga_2ZnO_7$ (a symmetry property of a crystal: P63/MMC), $In_2O_3$ (a symmetry property of a crystal: R-3C), $Ga_2O_3$ (a symmetry property of a crystal: R-3C), and ZnO (a symmetry property of a crystal: P63MC) was obtained by first principle calculation. Here, surface energy means energy per unit area which is needed to cut out a crystal surface from a bulk crystal. That is, it can be said that as surface energy is larger, a surface structure is more unstable in terms of energy and a seed crystal is difficult to generate.

CASTEP which is first principle calculation software based on the density functional theory is used for the above calculation. In the above calculation, surface energy is obtained from the following formula (1).

[Formula 1]

$$\text{(Surface energy)} = \frac{\text{(Energy of surface structure)} - \text{(Energy of crystal structure)}}{\text{(Surface area)}} \quad (1)$$

Ga and Zn are adjacent to each other in the periodic table, and atomic radiuses thereof are almost the same; therefore, arrangements thereof are random. That is, in some cases, Zn is arranged in a site in which Ga is arranged, and Ga is arranged in a site in which Zn is arranged. In order to deal with such a random arrangement, a virtual crystal approximation was used in the calculation. That is, a composition ratio of Ga to Zn is set to 2:1 in a site in which Ga or Zn is arranged, and a virtual atom in which Ga is 66.7% and Zn is 33.3% is arranged. More specifically, pseudopotentials of atoms were mixed at the above proportion and were assigned to virtual atoms.

Figure 11A:
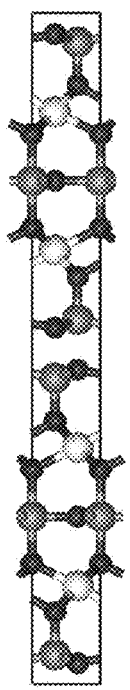
FIGS. 11A to 11D are diagrams illustrating a crystal structure and a surface structure used for surface energy calculation.
Figure 11B:
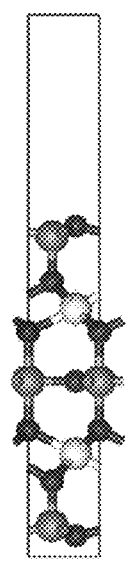
Figure 11C:
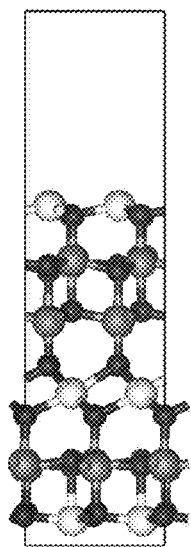
Figure 11D:
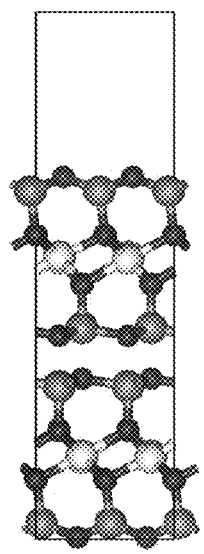
Figures 14A, 14B:
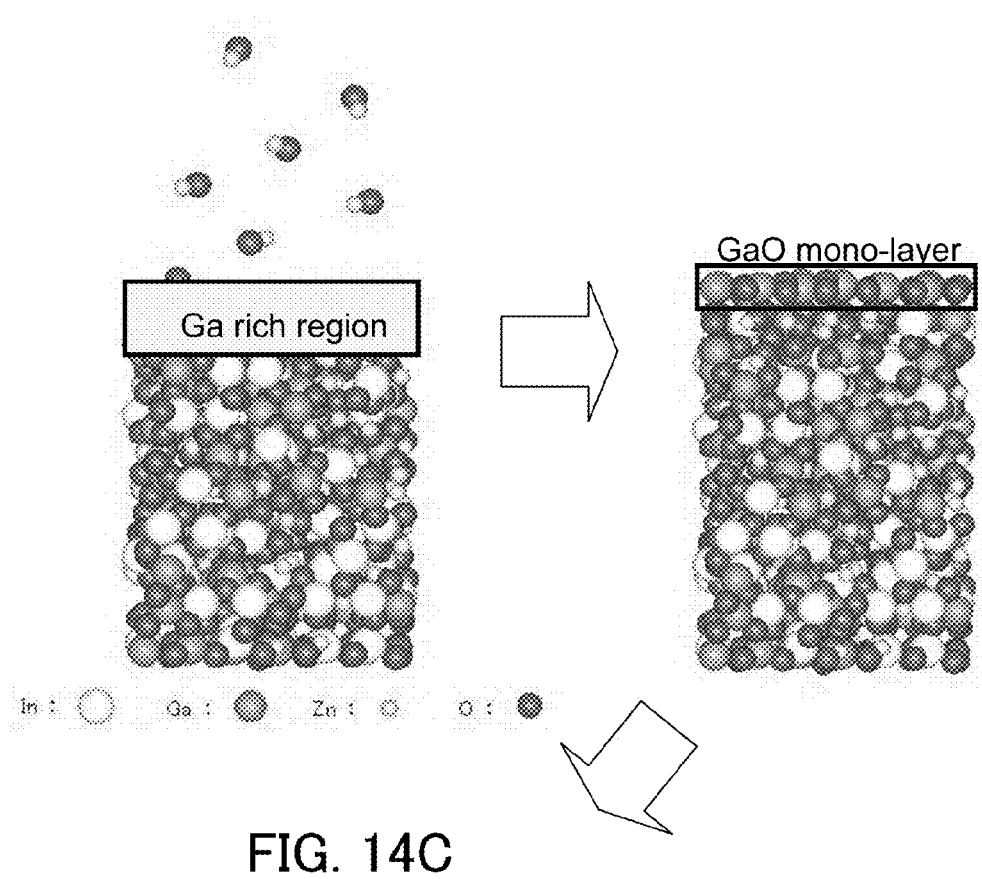
FIGS. 14A to 14C are diagrams illustrating a formation mechanism and a growth mechanism of the crystal grains of $In_2Ga_2ZnO_7$.
Figure 14C:
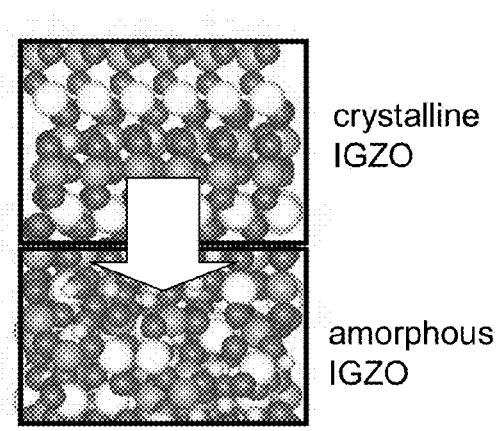

FIG. 11A shows a crystal structure used for the surface energy calculation of (001) plane of $In_2Ga_2ZnO_7$ and FIGS. 11B to 11D show the surface structures used for the surface energy calculation. FIG. 11B shows a structure in which O is on the outermost surface in the (001) plane (denoted by "(001):(Ga, Zn)O"), FIG. 11C shows a structure in which In is on the outermost surface in the (001) plane (denoted by "(001):In"), and FIG. 11D shows a structure in which Ga or Zn is on the outermost surface in the (001) plane (denoted by "(001):Ga, Zn"). Lattices of FIGS. 11B to 11D are taken so that they are minimum units of a periodic structure in an in-plane direction. Therefore, the sizes of the lattices in the in-plane direction of the (001) plane are different depending on the surface structure. Note that structures after structure optimization by first principle calculation are shown in FIGS. 11B to 11D. Ga or Zn is on the outermost surface in (001):Ga, Zn before structure optimization; however, O is on the outermost surface by structure optimization.

The calculation was performed in the following manner: after the most stable structure of the crystal including lattices is obtained, a crystal surface is cut out, and structure optimization is performed only on atom arrangement with the lattices fixed. Note that a thickness of a vacuum region where atoms do not exist was set to 1 nm. The details of the calculation conditions are shown in FIG. 12. In consideration of no periodicity in a direction vertical to the surface, the number of k point was 1. Similar calculations were also performed on the (100) plane of $In_2Ga_2ZnO_7$, $In_2O_3$, $Ga_2O_3$, and ZnO.

The calculation results of the surface energy are shown in FIG. 13. From FIG. 13, it can be found that in the surface structure of $In_2Ga_2ZnO_7$, the surface energy of (001):(Ga, Zn)O is the smallest. In, Ga, and Zn are metallic and become unstable in terms of energy due to the existence of surface charge. On the other hand, when a bond is terminated by O, the surface energy can be reduced.

From the calculation results of the surface energy, it can be easily understood that (001):In is difficult to form. This can be supported also from the observation results of FIG. 10 and the like.

By comparison of the surface energy of (001):(Ga, Zn)O and the surface energy of the (001) plane of ZnO, a formation mechanism and a growth mechanism of the crystal grains of $In_2Ga_2ZnO_7$ can be understood. The formation mechanism and the growth mechanism of the crystal grains of $In_2Ga_2ZnO_7$ will be briefly described with reference to FIGS. 14A to 14C.

The vapor pressure of ZnO is large and is easily vaporized. Thus, when heat treatment is performed, the composition ratio of Zn becomes small and that of Ga becomes large in the vicinity of the surface of the In—Ga—Zn—O-based amorphous oxide semiconductor layer (see FIG. 14A). When the surface energy of (001):(Ga, Zn)O and the surface energy of the (001) plane of ZnO are compared, the surface energy of (001):(Ga, Zn)O is small. A layer containing ZnO and GaO is formed on a surface, and the amount of ZnO is small on a surface thereof; therefore, a layer containing GaO is stably formed (see FIG. 14B). Accordingly, the crystal grains of $In_2Ga_2ZnO_7$ are grown from the above layer containing GaO (see FIG. 14C). That can be easily understood when it is assumed that the outermost surface is a layer containing Ga and the second layer is a layer containing In in FIG. 10.

Note that the surface energy of (001):(Ga, Zn)O of $In_2Ga_2ZnO_7$ is smaller than those of the main planes of $In_2O_3$, $Ga_2O_3$, and ZnO. Thus, it can be said that $In_2O_3$, $Ga_2O_3$, and ZnO are not separated from each other on the surface of the oxide semiconductor layer as far as it is determined in terms of the surface energy.

In crystal growth, on a plane having small surface energy, crystal grains tend to be formed more easily and crystals tend to be grown more easily, than on a plane having large surface energy. Therefore, (001):(Ga, Zn)O of $In_2Ga_2ZnO_7$ is likely to be crystallized in comparison with $In_2O_3$, $Ga_2O_3$, ZnO, and the like. In addition, the surface energy of (001):(Ga, Zn)O is smaller than those of the (100) plane of $In_2Ga_2ZnO_7$, (001):In, and (001):Ga, Zn. Thus, the outermost surface is likely to be (001):(Ga, Zn)O and be c-axis-oriented.

As described above, it can be seen that by heating the surface of the oxide semiconductor layer, the crystal grains of $In_2Ga_2ZnO_7$ which is c-axis-oriented are formed in the vicinity of the surface and grown. The oxide semiconductor layer has excellent electric characteristics, which is suitable for a semiconductor device. Alternatively, the oxide semiconductor layer has high reliability, which is suitable for a semiconductor device.

The methods, structures, and the like described in this embodiment can be combined as appropriate with any of the methods, structures, and the like described in the other embodiments.

(Embodiment 2)

In this embodiment, an example of a transistor as a semiconductor device and a manufacturing method thereof will be described with reference to FIGS. 15A to 15D and FIGS. 16A to 16D.

Figure 15A:
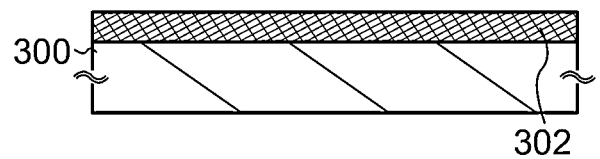
FIGS. 15A to 15D are cross-sectional views illustrating a manufacturing process of a semiconductor device.

First, a conductive layer 302 is formed over a substrate 300 (see FIG. 15A).

Any substrate can be used for the substrate 300 as long as it is a substrate having an insulating surface, for example, a glass substrate. It is preferable that the glass substrate be a non-alkali glass substrate. As a material of the non-alkali glass substrate, a glass material such as aluminosilicate glass, aluminoborosilicate glass, or barium borosilicate glass is used, for example. Besides, as the substrate 300, an insulating substrate formed using an insulator such as a ceramic substrate, a quartz substrate, or a sapphire substrate, a semiconductor substrate which is formed using a semiconductor material such as silicon and whose surface is covered with an insulating material, or a conductive substrate which is formed using a conductive material such as metal or stainless steel and whose surface is covered with an insulating material can be used. A plastic substrate can also be used as long as it can withstand heat treatment in a manufacturing process.

The conductive layer 302 is preferably formed using a conductive material such as aluminum (Al), copper (Cu), molybdenum (Mo), tungsten (W), or titanium (Ti). As a formation method, a sputtering method, a vacuum evaporation method, a CVD method, and the like are given. In the case of using aluminum (or copper) for the conductive layer 302, since aluminum itself (or copper itself) has disadvantages such as low heat resistance and a tendency to be corroded, it is preferably formed in combination with a conductive material having heat resistance.

As the conductive material having heat resistance, it is possible to use metal containing an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, a nitride containing any of these elements as its component, or the like. The conductive layer 302 may be formed by stacking the conductive material having heat resistance and aluminum (or copper).

Although not shown in the drawings, the substrate 300 may be provided with a base layer. The base layer has a function of preventing diffusion of an alkali metal (Li, Cs, Na, or the like), an alkaline earth metal (Ca, Mg, or the like), or other impurities from the substrate 300. In other words, provision of the base layer can realize improvement in the reliability of the semiconductor device. The base layer may be formed to have a single-layer structure or a stacked-layer structure using a variety of insulating materials such as silicon nitride or silicon oxide. Specifically, for example, a structure in which silicon nitride and silicon oxide are stacked in that order over the substrate 300 is favorable. This is because silicon nitride has a high blocking effect against an impurity. At the same time, in the case where silicon nitride is in contact with a semiconductor, there is a possibility that a problem occurs in the semiconductor element; thus, silicon oxide is preferably applied as a material to be in contact with the semiconductor.

Figure 15B:
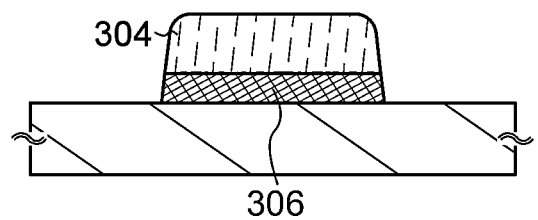

Next, a resist mask 304 is selectively formed over the conductive layer 302 and the conductive layer 302 is selectively etched using the resist mask 304, whereby a conductive layer 306 which functions as a gate electrode is formed (see FIG. 15B).

The resist mask 304 is formed through steps such as application of a resist material, light exposure using a photomask, and development. For the application of the resist material, a method such as a spin-coating method can be employed. Instead, the resist mask 304 may be selectively formed by a droplet discharging method, a screen printing method, or the like. In this case, the steps of light exposure using a photomask, development, and the like are not needed; therefore, improvement in productivity can be achieved. Note that the resist mask 304 is removed after the conductive layer 306 is formed by etching the conductive layer 302.

The resist mask 304 may be formed using a multi-tone mask. Here, the multi-tone mask is a mask capable of light exposure with multi-level light intensity. With the use of a multi-tone mask, one-time exposure and development process allow a resist mask with plural thicknesses (typically, two kinds of thicknesses) to be formed. By use of the multi-tone mask, increase in the number of steps can be suppressed.

As the above etching treatment, dry etching may be used, or wet etching may be used. In order to improve coverage of a gate insulating layer or the like which is formed later and prevent disconnection, the etching is preferably performed so that end portions of the conductive layer 306 are tapered. For example, the end portions are preferably tapered at a taper angle 20° or more and less than 90°. Here, the "taper angle" refers to an angle formed by a side surface of a layer which is tapered to a bottom surface thereof when the layer having a tapered shape is observed from a cross-sectional direction.

Figure 15C:
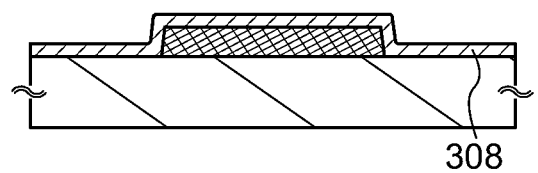

Next, an insulating layer 308 which functions as a gate insulating layer is formed so as to cover the conductive layer 306 (see FIG. 15C). The insulating layer 308 can be formed using a material such as silicon oxide, silicon oxynitride, silicon nitride, silicon nitride oxide, aluminum oxide, or tantalum oxide. The insulating layer 308 may also be formed by stacking films formed of these materials. These films are preferably formed to a thickness of 5 nm or more and 250 nm or less by a sputtering method or the like. For example, as the insulating layer 308, a silicon oxide film can be formed to a thickness of 100 nm by a sputtering method.

Alternatively, the insulating layer 308 with a stacked-layer structure may be formed by combination of a sputtering method and a CVD method (a plasma CVD method or the like). For example, a lower layer of the insulating layer 308 (a region in contact with the conductive layer 306) is formed by a plasma CVD method and an upper layer of the insulating layer 308 can be formed by a sputtering method. Since a film with favorable step coverage is easily formed by a plasma CVD method, it is suitable for a method for forming a film directly above the conductive layer 306. In the case of using a sputtering method, since it is easy to reduce hydrogen concentration in the film as compared with the case of using a plasma CVD method, by providing a film by a sputtering method in a region in contact with a semiconductor layer, the hydrogen in the insulating layer 308 can be prevented from being diffused into the semiconductor layer. Specifically, in an oxide semiconductor layer, since hydrogen has a great influence on characteristics, it is effective to employ such a structure.

Note that in this specification and the like, an oxynitride refers to a substance that contains more oxygen (atoms) than nitrogen (atoms). For example, a silicon oxynitride is a substance including oxygen, nitrogen, silicon, and hydrogen in ranges of 50 at. % to 70 at. %, 0.5 at. % to 15 at. %, 25 at. % to 35 at. %, and 0.1 at. % to 10 at. %, respectively. Further, nitride oxide refers to a substance that contains more nitrogen (atoms) than oxygen (atoms). For example, a silicon nitride oxide is a substance including oxygen, nitrogen, silicon, and hydrogen in ranges of 5 at. % to 30 at. %, 20 at. % to 55 at. %, 25 at. % to 35 at. %, and 10 at. % to 25 at. %, respectively. Note that the above ranges are obtained by measurement using Rutherford backscattering spectrometry (RBS) or hydrogen forward scattering spectrometry (HFS). Moreover, the total of the content rate of the constituent elements does not exceed 100 at. %.

Figure 15D:
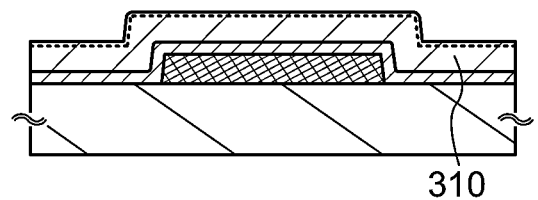

Next, a semiconductor layer 310 is formed so as to cover the insulating layer 308 (see FIG. 15D). In this embodiment, the oxide semiconductor layer described in the above embodiment is applied to the semiconductor layer 310. The above embodiment can be referred to for details of the oxide semiconductor layer.

Note that in this embodiment, the case where the semiconductor layer 310 is formed using a single layer is described; however, the semiconductor layer 310 may be formed using a stacked-layer structure. For example, the semiconductor layer 310 may be formed by stacking two or more oxide semiconductor layers each of which has a different composition over the insulating layer 308. Alternatively, the semiconductor layer 310 may be formed by stacking two or more oxide semiconductor layers each of which has different crystallinity.

Figure 16A:
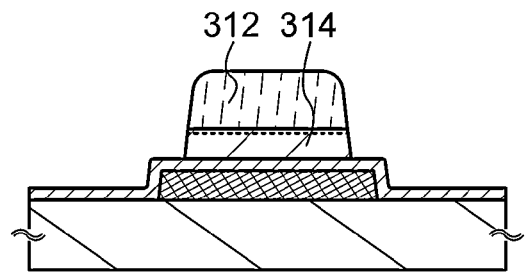
FIGS. 16A to 16D are cross-sectional views illustrating a manufacturing process of a semiconductor device.

Next, a resist mask 312 is selectively formed over the semiconductor layer 310 and the semiconductor layer 310 is selectively etched using the resist mask 312, whereby a semiconductor layer 314 is formed (see FIG. 16A). Here, the resist mask 312 can be formed in a manner similar to that of the resist mask 304. Note that the resist mask 312 is removed after the semiconductor layer 314 is formed by etching the semiconductor layer 310.

Either wet etching or dry etching can be employed as an etching method used for the etching of the semiconductor layer 310. For example, an unnecessary portion of the semiconductor layer 310 is removed by wet etching using a mixed solution of acetic acid, nitric acid, and phosphoric acid, so that the semiconductor layer 314 can be formed. Note that an etchant (an etching solution) used in the above wet etching may be any solution which can etch the semiconductor layer 310, and not limited to the above-described solution.

When dry etching is performed, for example, a gas including chlorine or a gas including chlorine to which oxygen is added is preferably used. This is because by using a gas including chlorine, etching selectivity of the semiconductor layer 310 with respect to the conductive layer or the base layer can be easily obtained.

As an etching apparatus used for the dry etching, an etching apparatus using a reactive ion etching method (an RIE method), or a dry etching apparatus using a high-density plasma source such as electron cyclotron resonance (ECR) or inductively coupled plasma (ICP) can be used. An enhanced capacitively coupled plasma (ECCP) mode etching apparatus may be used by which uniform electric discharge can be obtained over a wide area as compared with an ICP etching apparatus. This ECCP mode etching apparatus can be employed even when a substrate of the tenth generation or later is used.

Figure 16B:
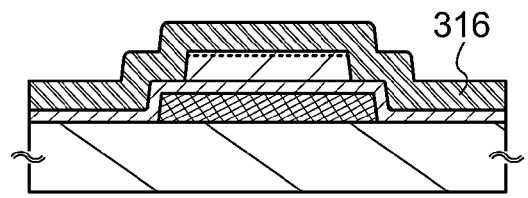

Next, a conductive layer 316 is formed so as to cover the insulating layer 308 and the semiconductor layer 314 (see FIG. 16B). The conductive layer 316 can be formed using a material and by a method which are similar to those of the conductive layer 302. For example, the conductive layer 316 can be formed to have a single-layer structure of a molybdenum layer or a titanium layer. Alternatively, the conductive layer 316 may be formed to have a stacked-layer structure and can have a stacked-layer structure of an aluminum layer and a titanium layer, for example. A three-layer structure in which a titanium layer, an aluminum layer, and a titanium layer are stacked in this order may be employed. A three-layer structure in which a molybdenum layer, an aluminum layer, and a molybdenum layer are stacked in this order may be employed. Further, an aluminum layer containing neodymium (an Al—Nd layer) may be used as the aluminum layer used for these stacked-layer structures. Further alternatively, the conductive layer 316 may have a single-layer structure of an aluminum layer containing silicon.

Figure 16C:
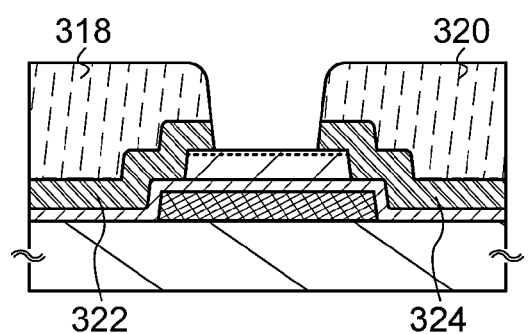

Next, a resist mask 318 and a resist mask 320 are selectively formed over the conductive layer 316 and the conductive layer 316 is selectively etched using the resist masks so as to form a conductive layer 322 which functions as one of a source electrode and a drain electrode and a conductive layer 324 which functions as the other of the source electrode and the drain electrode (see FIG. 16C). Here, the resist masks 318 and 320 can be formed in a manner similar to that of the resist mask 304. Note that the resist masks 318 and 320 are removed after the conductive layers 322 and 324 are formed by etching the conductive layer 316.

Note that either wet etching or dry etching can be employed as a method for etching the conductive layer 316.

Figure 16D:
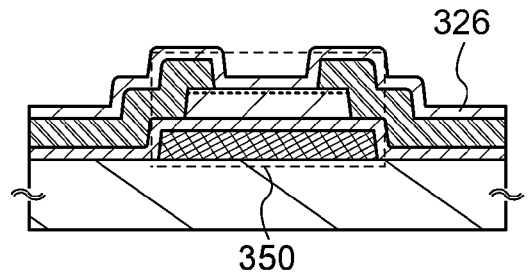

Next, an insulating layer 326 is formed so as to cover the conductive layer 322, the conductive layer 324, the semiconductor layer 314, and the like (see FIG. 16D). Here, the insulating layer 326 serves as a so-called interlayer insulating layer. The insulating layer 326 can be formed using a material such as silicon oxide, aluminum oxide, or tantalum oxide. The insulating layer 326 may also be formed by stacking films formed of these materials. Through the above steps, a transistor 350 using an oxide semiconductor layer is completed (see FIG. 16D).

As described in this embodiment, by manufacturing a semiconductor device with the use of the oxide semiconductor layer described in the above embodiment, the entry of impurities (e.g., moisture and the like) into the oxide semiconductor layer can be suppressed. Thus, the reliability of the semiconductor device can be increased.

Further, by manufacturing a semiconductor device with the use of the oxide semiconductor layer described in the above embodiment, a semiconductor device with favorable electric characteristics can be provided.

The methods, structures, and the like described in this embodiment can be combined as appropriate with any of the methods, structures, and the like described in the other embodiments.

(Embodiment 3)

In this embodiment, another example of a transistor as a semiconductor device and a manufacturing method thereof will be described with reference to FIGS. 17A to 17D and FIGS. 18A to 18D. Note that many parts of a method for manufacturing a semiconductor device in this embodiment are common to those in the above embodiments; therefore, description of the common parts is omitted below and only different parts will be described in detail.

Figure 17A:
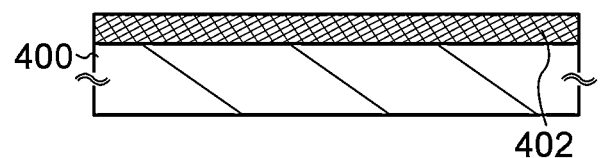
FIGS. 17A to 17D are cross-sectional views illustrating a manufacturing process of a semiconductor device.

First, a conductive layer 402 is formed over a substrate 400 (see FIG. 17A). The above embodiments (the description with reference to FIG. 4A and the like) can be referred to for the details of the substrate 400, the conductive layer 402, and the like. A base layer may be formed over the substrate 400. The above embodiment can also be referred to for the details of the base layer.

Figure 17B:
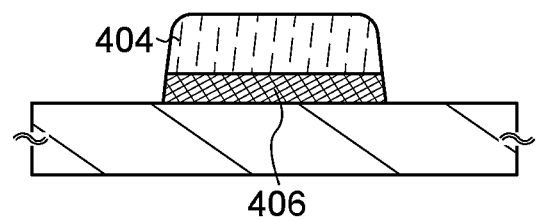

Next, a resist mask 404 is selectively formed over the conductive layer 402 and the conductive layer 402 is selectively etched using the resist mask 404, whereby a conductive layer 406 which functions as a gate electrode is formed (see FIG. 17B). The above embodiment (the description with reference to FIG. 15B and the like) can be referred to for the details of the resist mask 404, the conductive layer 406, the etching, and the like.

Figure 17C:
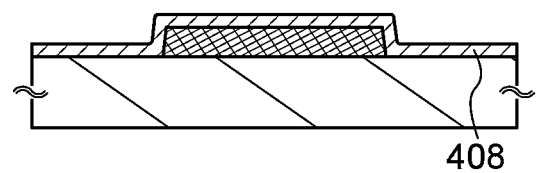

Then, an insulating layer 408 which functions as a gate insulating layer is formed so as to cover the conductive layer 406 (see FIG. 17C). The above embodiment (the description with reference to FIG. 15C and the like) can be referred to for the details of the insulating layer 408 and the like.

Figure 17D:
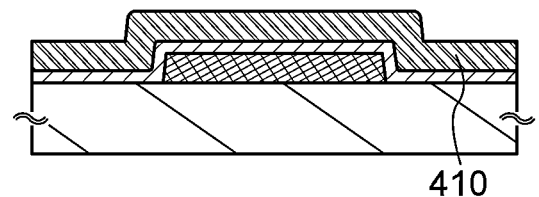

A conductive layer 410 is formed so as to cover the insulating layer 408 (see FIG. 17D). The conductive layer 410 can be formed using a material and by a method which are similar to those of the conductive layer 402. In other words, the above embodiment (the description with reference to FIG. 15A, FIG. 16B, and the like) can be referred to for the details.

Figure 18A:
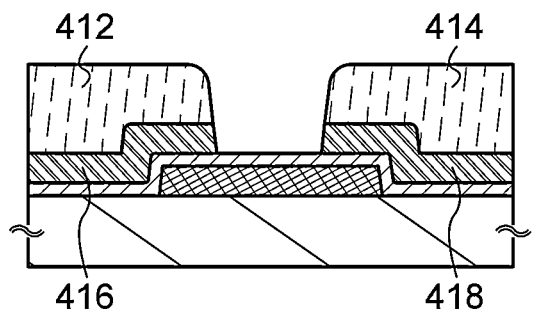
FIGS. 18A to 18D are cross-sectional views illustrating a manufacturing process of a semiconductor device.

Next, a resist mask 412 and a resist mask 414 are selectively formed over the conductive layer 410 and the conductive layer 410 is selectively etched using the resist masks so as to form a conductive layer 416 which functions as one of a source electrode and a drain electrode and a conductive layer 418 which functions as the other of the source electrode and the drain electrode (see FIG. 18A). The resist masks 412 and 414 can be formed in a manner similar to that of the resist mask 404. Either wet etching or dry etching can be employed as a method for etching the conductive layer 410. In other words, the above embodiment (the description with reference to FIG. 15B, FIG. 16C, and the like) can be referred to for the details of the resist masks and the etching.

Figure 18B:
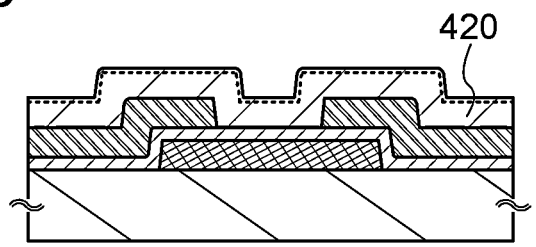

Next, a semiconductor layer 420 is formed so as to cover the insulating layer 408, the conductive layer 416, the conductive layer 418 and the like (see FIG. 18B). In this embodiment, the oxide semiconductor layer described in the above embodiment is applied to the semiconductor layer 420. The above embodiment can be referred to for the details of the oxide semiconductor layer.

Figure 18C:
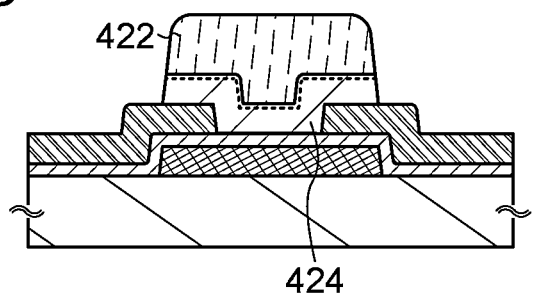

Next, a resist mask 422 is selectively formed over the semiconductor layer 420 and the semiconductor layer 420 is selectively etched using the resist mask 422 so as to form a semiconductor layer 424 (see FIG. 18C). The above embodiment (the description with reference to FIG. 15B, FIG. 16A, and the like) can be referred to for the details of the resist mask and the etching.

Figure 18D:
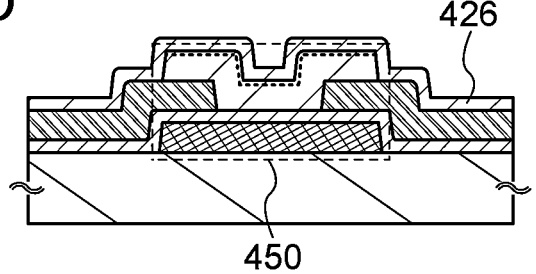

Then, an insulating layer 426 is formed so as to cover the conductive layer 416, the conductive layer 418, the semiconductor layer 424, and the like (see FIG. 18D). Here, the insulating layer 426 serves as a so-called interlayer insulating layer. The insulating layer 426 can be formed using a material such as silicon oxide, aluminum oxide, or tantalum oxide. The insulating layer 426 may also be formed by stacking films formed of these materials. Through the above steps, a transistor 450 using an oxide semiconductor layer is completed (see FIG. 18D).

As described in this embodiment, by manufacturing a semiconductor device with the use of the oxide semiconductor layer described in the above embodiment, the entry of impurities (e.g., moisture and the like) into the oxide semiconductor layer can be suppressed. Thus, the reliability of the semiconductor device can be increased.

Further, by manufacturing a semiconductor device with the use of the oxide semiconductor layer described in the above embodiment, a semiconductor device with favorable electric characteristics can be provided.

The methods, structures, and the like described in this embodiment can be combined as appropriate with any of the methods, structures, and the like described in the other embodiments.

(Embodiment 4)

In this embodiment, another example of a transistor as a semiconductor device and a manufacturing method thereof will be described with reference to FIGS. 19A to 19D and FIGS. 20A to 20D. Note that many parts of a method for manufacturing a semiconductor device in this embodiment are common to those in the above embodiments; therefore, description of the common parts is omitted below and only different parts will be described in detail.

Figure 19A:
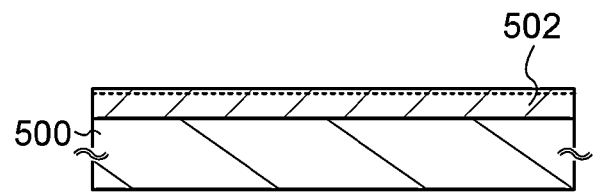
FIGS. 19A to 19D are cross-sectional views illustrating a manufacturing process of a semiconductor device.
Figure 19B:
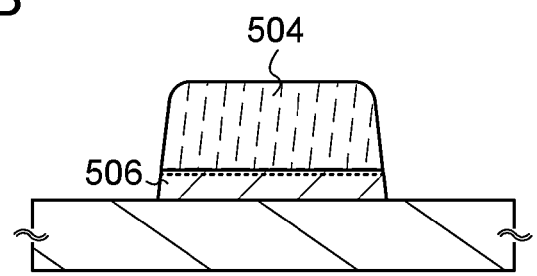

First, a semiconductor layer 502 is formed over a substrate 500 (see FIG. 19A). After a resist mask 504 is selectively formed over the semiconductor layer 502, the semiconductor layer 502 is selectively etched using the resist mask 504, whereby a semiconductor layer 506 is formed (see FIG. 19B). In this embodiment, the oxide semiconductor layer described in the above embodiment is applied to the semiconductor layer 502. The above embodiment can be referred to for the details of the oxide semiconductor layer. The above embodiments can also be referred to for the other details.

Figure 19C:
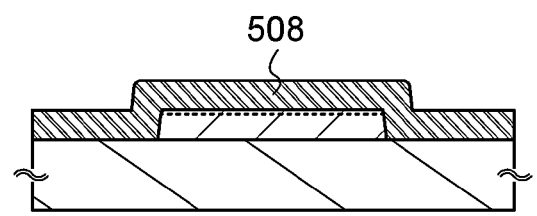
Figure 19D:
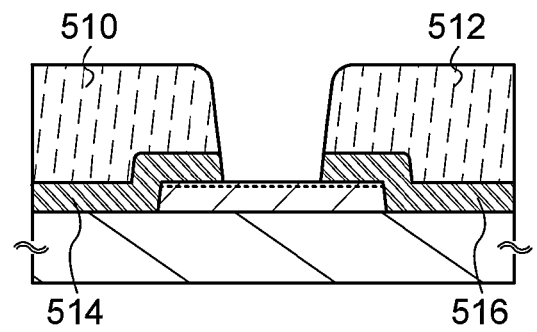

Next, a conductive layer 508 is formed so as to cover the semiconductor layer 506 (see FIG. 19C). After a resist mask 510 and a resist mask 512 are selectively formed over the conductive layer 508, the conductive layer 508 is selectively etched using the resist masks, so that a conductive layer 514 which functions as one of a source electrode and a drain electrode and a conductive layer 516 which functions as the other of the source electrode and the drain electrode are formed (see FIG. 19D). The above embodiments can be referred to for the details.

Figure 20A:
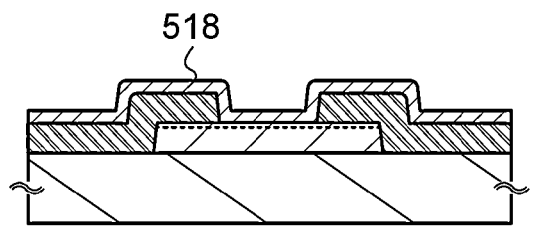
FIGS. 20A to 20D are cross-sectional views illustrating a manufacturing process of a semiconductor device.
Figure 20B:
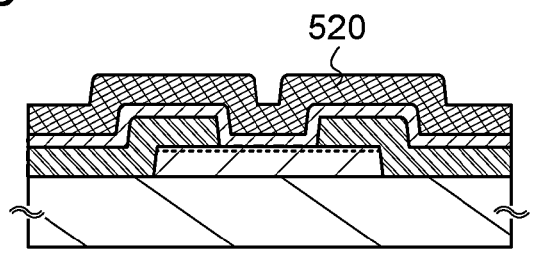
Figure 20C:
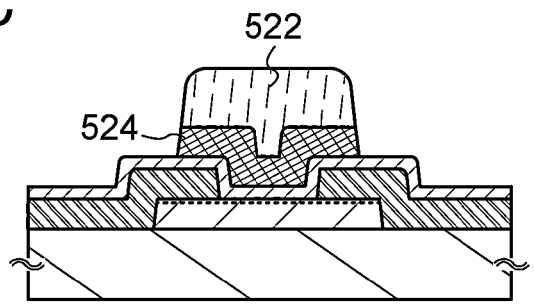
Figure 20D:
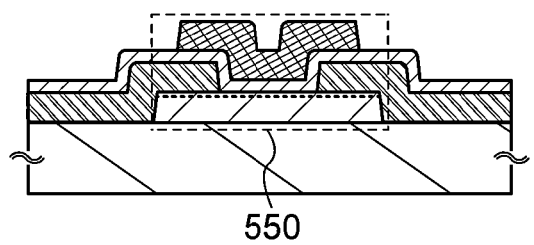

Next, an insulating layer 518 serving as a gate insulating layer is formed so as to cover the semiconductor layer 506, the conductive layer 514, and the conductive layer 516 (see FIG. 20A). Then, a conductive layer 520 is formed over the insulating layer 518 (see FIG. 20B). After a resist mask 522 is selectively formed over the conductive layer 520, the conductive layer 520 is selectively etched using the resist mask 522, whereby a conductive layer 524 serving as a gate electrode is formed (see FIG. 20C). The above embodiments can also be referred to for the details. Through the above steps, a transistor 550 using an oxide semiconductor layer is completed (see FIG. 20D).

As described in this embodiment, by manufacturing a semiconductor device with the use of the oxide semiconductor layer described in the above embodiment, the entry of impurities (e.g., moisture and the like) into the oxide semiconductor layer can be suppressed. Thus, the reliability of the semiconductor device can be increased.

Further, by manufacturing a semiconductor device with the use of the oxide semiconductor layer described in the above embodiment, a semiconductor device with favorable electric characteristics can be provided.

The methods, structures, and the like described in this embodiment can be combined as appropriate with any of the methods, structures, and the like described in the other embodiments.

(Embodiment 5)

In this embodiment, another example of a transistor as a semiconductor device and a manufacturing method thereof will be described with reference to FIGS. 21A to 21D and FIGS. 22A to 22D. Note that many parts of a method for manufacturing a semiconductor device in this embodiment are common to those in the above embodiments; therefore, description of the common parts is omitted below and only different parts will be described in detail.

Figure 21A:
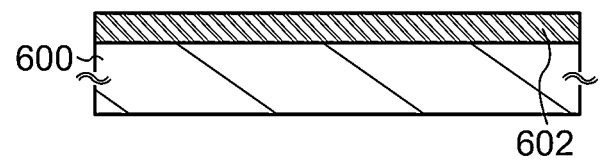
FIGS. 21A to 21D are cross-sectional views illustrating a manufacturing process of a semiconductor device.
Figure 21B:
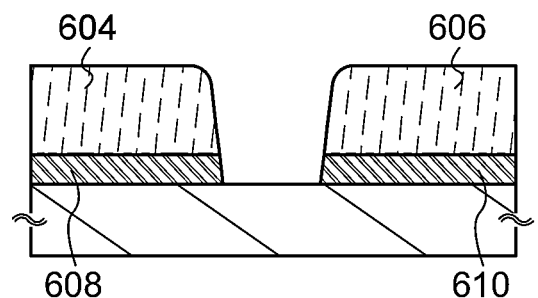

First, a conductive layer 602 is formed over a substrate 600 (see FIG. 21A). After a resist mask 604 and a resist mask 606 are selectively formed over the conductive layer 602, the conductive layer 602 is selectively etched using the resist masks, so that a conductive layer 608 which functions as one of a source electrode and a drain electrode and a conductive layer 610 which functions as the other of the source electrode and the drain electrode are formed (see FIG. 21B). The above embodiments can be referred to for the details.

Figure 21C:
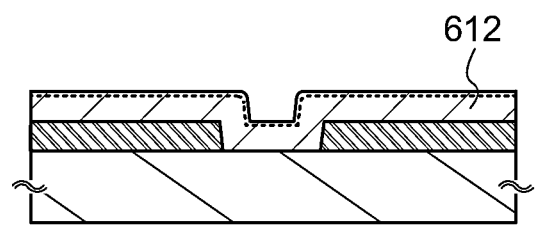
Figure 21D:
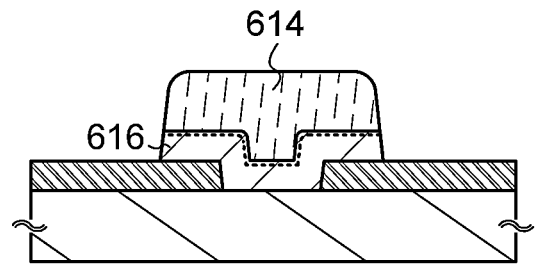

Next, a semiconductor layer 612 in contact with the conductive layer 608 and the conductive layer 610 is formed (see FIG. 21C). After a resist mask 614 is selectively formed over the semiconductor layer 612, the semiconductor layer 612 is selectively etched using the resist mask 614, so that a semiconductor layer 616 is formed (see FIG. 21D). In this embodiment, the oxide semiconductor layer described in the above embodiment is applied to the semiconductor layer 612. The above embodiment can be referred to for the details of the oxide semiconductor layer. The above embodiments can also be referred to for the other details.

Figure 22A:
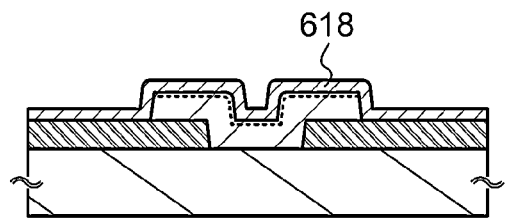
FIGS. 22A to 22D are cross-sectional views illustrating a manufacturing process of a semiconductor device.
Figure 22B:
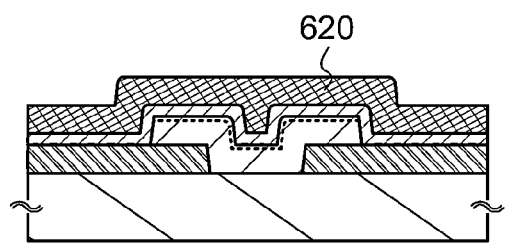
Figure 22C:
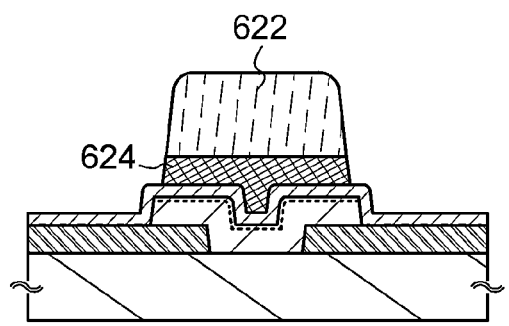
Figure 22D:
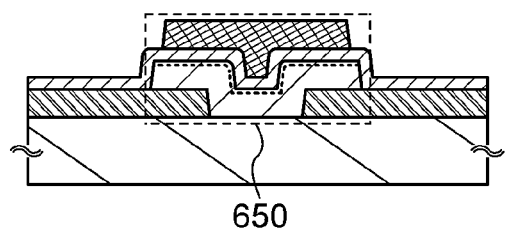

Next, an insulating layer 618 serving as a gate insulating layer is formed so as to cover the semiconductor layer 616, the conductive layer 608, and the conductive layer 610 (see FIG. 22A). Accordingly, a conductive layer 620 is formed over the insulating layer 618 (see FIG. 22B). After a resist mask 622 is selectively formed over the conductive layer 620, the conductive layer 620 is selectively etched using the resist mask 622, whereby a conductive layer 624 serving as a gate electrode is formed (see FIG. 22C). The above embodiments can be referred to for the details. Through the above steps, a transistor 650 using an oxide semiconductor layer is completed (see FIG. 22D).

As described in this embodiment, by manufacturing a semiconductor device with the use of the oxide semiconductor layer described in the above embodiment, the entry of impurities (e.g., moisture and the like) into the oxide semiconductor layer can be suppressed. Thus, the reliability of the semiconductor device can be increased.

Further, by manufacturing a semiconductor device with the use of the oxide semiconductor layer described in the above embodiment, a semiconductor device with favorable electric characteristics can be provided.

The methods, structures, and the like described in this embodiment can be combined as appropriate with any of the methods, structures, and the like described in the other embodiments.

(Embodiment 6)

In this embodiment, a structure of a display device including an electrophoretic element will be described with reference to FIGS. 23A and 23B, as an example of using the semiconductor device described in any of the above embodiments. Note that in this embodiment, an example of a display device including an electrophoretic element will be described; however, a display device for which a semiconductor device according to one embodiment of the disclosed invention can be used is not limited thereto. The semiconductor device according to one embodiment of the disclosed invention can be applied to a display device including a variety of display elements such as a liquid crystal display element or an electroluminescent element.

Figure 23A:
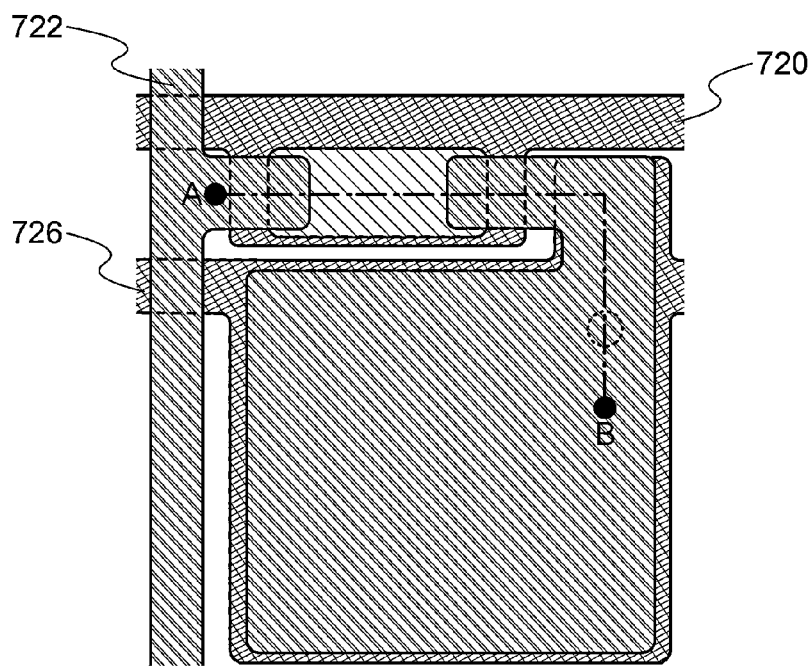
FIGS. 23A and 23B illustrate an example of a display device.
Figure 23B:
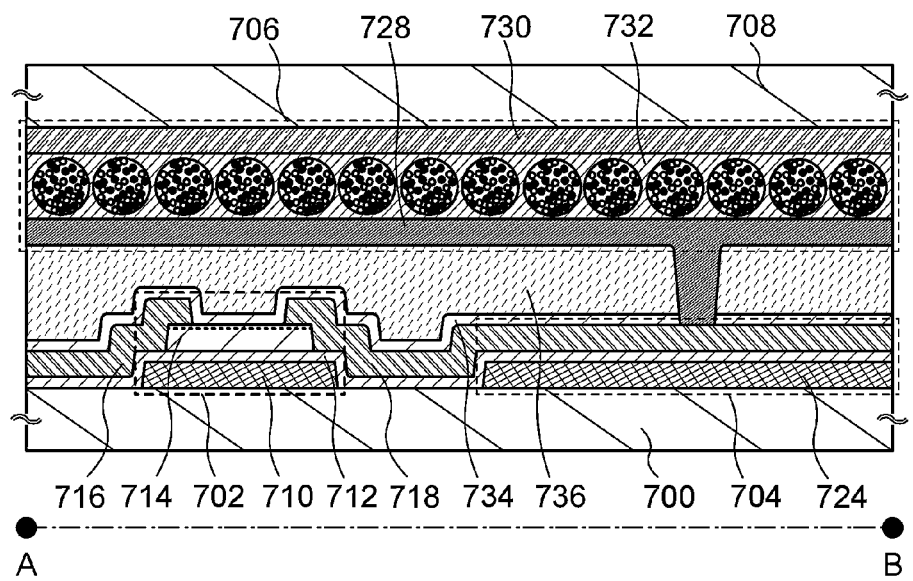

FIG. 23A illustrates a plan view of a pixel of a display device, and FIG. 23B illustrates a cross-sectional view along line A-B in FIG. 23A. The display device illustrated in FIGS. 23A and 23B includes a substrate 700, a transistor 702 and a capacitor 704 formed over the substrate 700, an electrophoretic element 706 formed over the transistor 702 and the capacitor 704, and a light-transmitting substrate 708 formed over the electrophoretic element 706. Note that the electrophoretic element 706 is not illustrated in FIG. 23A for simplicity.

The transistor 702 includes a conductive layer 710, an insulating layer 712 which covers the conductive layer 710, a semiconductor layer 714 formed over the insulating layer 712, a conductive layer 716 and a conductive layer 718 which are in contact with the semiconductor layer 714. Here, the conductive layer 710 functions as a gate electrode of the transistor; the insulating layer 712 functions as a gate insulating layer of the transistor; the conductive layer 716 functions as a first terminal (one of a source terminal and a drain terminal) of the transistor; and the conductive layer 718 functions as a second terminal (the other of the source terminal and the drain terminal) of the transistor. The above embodiments can also be referred to for the details.

Additionally, the conductive layer 710 is electrically connected to a gate line 720, and the conductive layer 716 is electrically connected to a source line 722 in the above. The conductive layer 710 may be integrated with the gate line 720, and the conductive layer 716 may be integrated with the source line 722.

The capacitor 704 includes the conductive layer 718, the insulating layer 712, and a conductive layer 724. The capacitor 704 has a function of holding a signal which is input to a pixel. The above components of the capacitor 704 can be formed together with components of the transistor.

In the above, the conductive layer 724 is electrically connected to a capacitor wiring 726. The conductive layer 718 functions as one terminal of the capacitor. The insulating layer 712 functions as a dielectric. The conductive layer 724 functions as the other terminal of the capacitor. The conductive layer 724 may be integrated with the capacitor wiring 726.

The electrophoretic element 706 includes a pixel electrode 728, a common electrode 730 (it may be called a counter electrode), and a layer 732 containing charged particles which is provided between the pixel electrode 728 and the common electrode 730. As the charged particles contained in the layer 732 containing charged particles, titanium oxide or the like can be used as positively-charged particles, and carbon black or the like can be used as negatively-charged particles. In addition, a single material selected from a conductor, an insulator, a semiconductor, a magnetic material, a liquid crystal material, a ferroelectric material, an electroluminescent material, an electrochromic material, and a magnetophoretic material, or a composite material formed using any of these materials can also be used.

In the above, the pixel electrode 728 is electrically connected to the conductive layer 718 through an opening provided in an insulating layer 734 and an insulating layer 736 which cover the transistor 702 and the capacitor 704. The common electrode 730 is electrically connected to a common electrode of another pixel.

The above structure makes it possible to control an electric field applied to the layer 732 containing charged particles, and to control the arrangement of the charged particles in the layer 732 containing charged particles. Thus, display can be realized. The above structure is merely an example, and the display device using the semiconductor device according to one embodiment of the disclosed invention is not limited to the above structure.

The methods, structures, and the like described in this embodiment can be combined as appropriate with any of the methods, structures, and the like described in the other embodiments.

(Embodiment 7)

In this embodiment, applications of the display device illustrated in the above embodiment are described with reference to specific examples in FIGS. 24A to 24D.

Figure 24A:
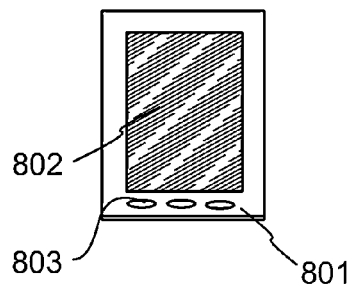
FIGS. 24A to 24D are diagrams each showing an application of a display device.

FIG. 24A shows a portable information terminal, which includes a housing 801, a display portion 802, operation buttons 803, and the like. The display device described in the above embodiment can be applied to the display portion 802.

Figure 24B:
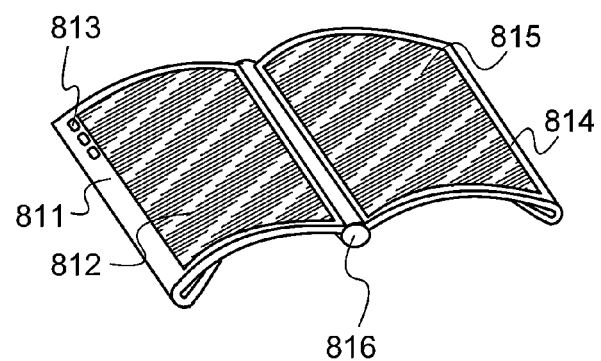

FIG. 24B is an example of an e-book reader on which the display device described in the above embodiment is mounted. A first housing 811 includes a first display portion 812 and operation buttons 813, and a second housing 814 includes a second display portion 815. The display device described in the above embodiment can be applied to the first display portion 812 or the second display portion 815. In addition, the first housing 811 and the second housing 814 can be opened and closed with a support portion 816. With such a structure, the e-book reader can be handled like a paper book.

Figure 24C:
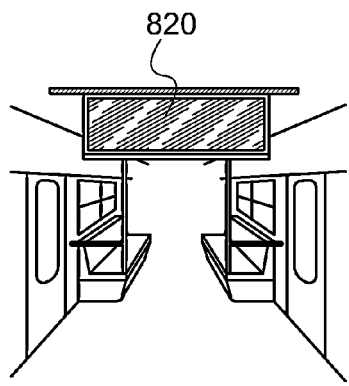

FIG. 24C illustrates a display device 820 for advertisement in a vehicle. In the case where an advertising medium is printed paper, the advertisement is replaced by hand; however, by using the display device, the advertising display can be changed in a short time with less manpower. In addition, an image can be stably displayed without display deterioration.

Figure 24D:
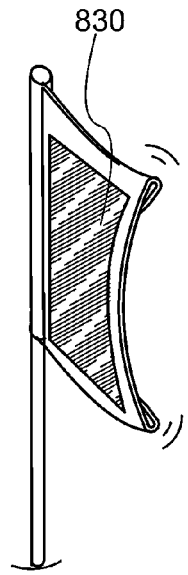

FIG. 24D illustrates a display device 830 for outdoor advertisement. The display device is manufactured using a flexible substrate and can enhance the advertising effect by being waved.

The methods, structures, and the like described in this embodiment can be combined as appropriate with any of the methods, structures, and the like described in the other embodiments.

This application is based on Japanese Patent Application serial no. 2009-234507 filed with the Japan Patent Office on Oct. 8, 2009, the entire contents of which are hereby incorporated by reference.

What is claimed is:

1. A semiconductor device comprising:
 a substrate;
 a gate electrode layer over the substrate;
 a gate insulating layer over the gate electrode layer;
 a first oxide semiconductor layer over the gate insulating layer;
 a second oxide semiconductor layer over the first oxide semiconductor layer; and a source electrode layer and a drain electrode layer electrically connected to the second oxide semiconductor layer, wherein each of the first oxide semiconductor layer and the second oxide semiconductor layer comprises an oxide semiconductor containing In, Ga, and Zn, wherein the second oxide semiconductor layer includes crystals each containing In, Ga, and Zn as main components, wherein in each of the crystals, a length in a c-axis direction is smaller than a length in an a-axis direction or a b-axis direction, and wherein the crystals are oriented so that c-axes of the crystals are almost vertical with respect to a surface of the second oxide semiconductor layer.

2. The semiconductor device according to claim 1, wherein the crystals include a crystal structure of $In_2Ga_2ZnO_7$.

3. The semiconductor device according to claim 1, wherein the crystals include a crystal structure of $InGaZnO_4$.

4. The semiconductor device according to claim 1, wherein the crystals include a mix of crystal structures of $In_2Ga_2ZnO_7$ and $InGaZnO_4$.

5. The semiconductor device according to claim 1, wherein the first oxide semiconductor layer includes an amorphous region.

6. The semiconductor device according to claim 5, wherein a Zn content is less than an In content or a Ga content in the amorphous region.

7. The semiconductor device according to claim 1, further comprising an insulating layer covering the second oxide semiconductor layer.

8. The semiconductor device according to claim 1, wherein a thickness of the second oxide semiconductor layer is 20 nm or less.

9. A semiconductor device comprising:
a substrate;
a first oxide semiconductor layer over the substrate;
a second oxide semiconductor layer over the first oxide semiconductor layer;
a source electrode layer and a drain electrode layer electrically connected to the second oxide semiconductor layer;
a gate insulating layer over the second oxide semiconductor layer, the source electrode layer and the drain electrode layer; and
a gate electrode layer over the gate insulating layer,
wherein each of the first oxide semiconductor layer and the second oxide semiconductor layer comprises an oxide semiconductor containing In, Ga and Zn,
wherein the second oxide semiconductor layer includes crystals each containing In, Ga, and Zn as main components,
wherein in each of the crystals, a length in a c-axis direction is smaller than a length in an a-axis direction or a b-axis direction, and
wherein the crystals are oriented so that c-axes of the crystals are almost vertical with respect to a surface of the second oxide semiconductor layer.

10. The semiconductor device according to claim 9, wherein the crystals include a crystal structure of $In_2Ga_2ZnO_7$.

11. The semiconductor device according to claim 9, wherein the crystals include a crystal structure of $InGaZnO_4$.

12. The semiconductor device according to claim 9, wherein the crystals include a mix of crystal structures of $In_2Ga_2ZnO_7$ and $InGaZnO_4$.

13. The semiconductor device according to claim 9, wherein the first oxide semiconductor layer includes an amorphous region.

14. The semiconductor device according to claim 13, wherein a Zn content is less than an In content or a Ga content in the amorphous region.

15. The semiconductor device according to claim 9, wherein a thickness of the second oxide semiconductor layer is 20 nm or less.

* * * * *